United States Patent
Yu et al.

(10) Patent No.: US 10,580,690 B2
(45) Date of Patent: *Mar. 3, 2020

(54) STAIRCASE ENCAPSULATION IN 3D NAND FABRICATION

(71) Applicant: Lam Research Corporation, Fremont, CA (US)

(72) Inventors: Yongsik Yu, Milpitas, CA (US); Bart J. van Schravendijk, Palo Alto, CA (US); Nagraj Shankar, Tualatin, OR (US); Bhadri N. Varadarajan, Beaverton, OR (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/972,554

(22) Filed: May 7, 2018

(65) Prior Publication Data
US 2018/0330985 A1    Nov. 15, 2018

Related U.S. Application Data

(63) Continuation of application No. 15/408,291, filed on Jan. 17, 2017, now Pat. No. 10,002,787.
(Continued)

(51) Int. Cl.
*H01L 21/768* (2006.01)
*H01L 23/522* (2006.01)
(Continued)

(52) U.S. Cl.
CPC .... *H01L 21/76816* (2013.01); *H01L 21/0228* (2013.01); *H01L 21/02167* (2013.01);
(Continued)

(58) Field of Classification Search
None
See application file for complete search history.

(56) References Cited

U.S. PATENT DOCUMENTS

| 4,177,474 A | 12/1979 | Ovshinsky |
|---|---|---|
| 4,656,110 A | 4/1987 | Yamazaki |

(Continued)

FOREIGN PATENT DOCUMENTS

| CA | 868641 A | 4/1971 |
|---|---|---|
| CN | 1714168 A | 12/2005 |

(Continued)

OTHER PUBLICATIONS

U.S. Office Action dated Dec. 19, 2014 issued in U.S. Appl. No. 13/907,699.
(Continued)

*Primary Examiner* — Asok K Sarkar
(74) *Attorney, Agent, or Firm* — Weaver Austin Villeneuve & Sampson LLP

(57) ABSTRACT

Methods and apparatuses for depositing an encapsulation layer over a staircase structure during fabrication of a 3D NAND structure to prevent degradation of an oxide-oxide interface and to prevent punchthrough of a wordline are provided. The encapsulation layer is a carbon-containing conformal film deposited over a staircase structure of alternating oxide and nitride layers prior to depositing oxide over the staircase structure.

14 Claims, 17 Drawing Sheets

Related U.S. Application Data

(60) Provisional application No. 62/435,500, filed on Dec. 16, 2016, provisional application No. 62/426,035, filed on Nov. 23, 2016.

(51) Int. Cl.
*H01L 21/56* (2006.01)
*H01L 21/02* (2006.01)
*H01L 27/11575* (2017.01)
*H01L 27/11582* (2017.01)

(52) U.S. Cl.
CPC ........ *H01L 21/02274* (2013.01); *H01L 21/56* (2013.01); *H01L 27/11575* (2013.01); *H01L 27/11582* (2013.01)

(56) References Cited

U.S. PATENT DOCUMENTS

| | | | |
|---|---|---|---|
| 4,895,789 A | 1/1990 | Motte et al. | |
| 4,952,658 A | 8/1990 | Kalchauer et al. | |
| 5,034,355 A | 7/1991 | Tani et al. | |
| 5,108,965 A | 4/1992 | Tani et al. | |
| 5,324,690 A | 6/1994 | Gelatos et al. | |
| 5,447,816 A | 9/1995 | Kodama et al. | |
| 5,464,699 A | 11/1995 | Baldi | |
| 5,518,572 A | 5/1996 | Kinoshita et al. | |
| 5,567,243 A | 10/1996 | Foster et al. | |
| 5,654,208 A | 8/1997 | Harris et al. | |
| 5,739,579 A | 4/1998 | Chiang et al. | |
| 5,958,324 A | 9/1999 | Bujalski et al. | |
| 6,045,877 A | 4/2000 | Gleason et al. | |
| 6,100,587 A | 8/2000 | Merchant et al. | |
| 6,150,719 A | 11/2000 | Saia et al. | |
| 6,159,871 A | 12/2000 | Loboda et al. | |
| 6,197,688 B1 | 3/2001 | Simpson | |
| 6,242,686 B1 | 6/2001 | Kishimoto et al. | |
| 6,262,445 B1 | 7/2001 | Swanson et al. | |
| 6,316,167 B1 | 11/2001 | Angelopoulos et al. | |
| 6,352,945 B1 | 3/2002 | Matsuki | |
| 6,365,527 B1 | 4/2002 | Yang et al. | |
| 6,383,299 B1 | 5/2002 | Yuda et al. | |
| 6,383,898 B1 | 5/2002 | Kishimoto | |
| 6,383,955 B1 | 5/2002 | Matsuki et al. | |
| 6,399,484 B1 | 6/2002 | Yamasaki et al. | |
| 6,410,419 B1 | 6/2002 | Merchant et al. | |
| 6,417,092 B1 | 7/2002 | Jain et al. | |
| 6,424,044 B1 | 7/2002 | Han et al. | |
| 6,432,846 B1 | 8/2002 | Matsuki | |
| 6,448,186 B1 | 9/2002 | Olson et al. | |
| 6,455,409 B1 | 9/2002 | Subramanian et al. | |
| 6,465,366 B1 | 10/2002 | Nemani et al. | |
| 6,465,372 B1 | 10/2002 | Xia et al. | |
| 6,506,692 B2 | 1/2003 | Andideh | |
| 6,576,345 B1 | 6/2003 | Van Cleemput et al. | |
| 6,624,064 B1 | 9/2003 | Sahin et al. | |
| 6,670,715 B2 | 12/2003 | Yang et al. | |
| 6,764,958 B1 | 7/2004 | Nemani et al. | |
| 6,767,836 B2 | 7/2004 | San et al. | |
| 6,774,489 B2 | 8/2004 | Russell et al. | |
| 6,790,767 B2 | 9/2004 | Lee | |
| 6,790,788 B2 | 9/2004 | Li et al. | |
| 6,849,561 B1 | 2/2005 | Goundar | |
| 6,851,384 B2 | 2/2005 | Yuda et al. | |
| 6,855,645 B2 | 2/2005 | Tang et al. | |
| 6,875,687 B1 | 4/2005 | Weidman et al. | |
| 6,881,683 B2 | 4/2005 | Matsuki et al. | |
| 6,890,850 B2 | 5/2005 | Lee et al. | |
| 6,930,013 B2 | 8/2005 | Choi et al. | |
| 6,967,405 B1 | 11/2005 | Yu et al. | |
| 7,064,088 B2 | 6/2006 | Hyodo et al. | |
| 7,091,137 B2 | 8/2006 | Lee et al. | |
| 7,115,534 B2 | 10/2006 | Nguyen et al. | |
| 7,163,889 B2 | 1/2007 | Yu et al. | |
| 7,200,460 B2 | 4/2007 | Campana et al. | |
| 7,239,017 B1 | 7/2007 | Yu et al. | |
| 7,253,125 B1 | 8/2007 | Bandyopadhyay et al. | |
| 7,256,139 B2 | 8/2007 | Moghadam et al. | |
| 7,282,438 B1 | 10/2007 | Yu et al. | |
| 7,381,662 B1 | 6/2008 | Niu et al. | |
| 7,420,275 B1 | 9/2008 | Yu et al. | |
| 7,468,290 B2 | 12/2008 | Lukas et al. | |
| 7,524,735 B1 | 4/2009 | Gauri et al. | |
| 7,573,061 B1 | 8/2009 | Yu et al. | |
| 7,842,604 B1 | 11/2010 | Yu et al. | |
| 7,915,166 B1 | 3/2011 | Yu et al. | |
| 7,923,385 B2 | 4/2011 | Wu et al. | |
| 7,968,436 B1 | 6/2011 | Yu et al. | |
| 8,124,522 B1 | 2/2012 | Wu et al. | |
| 8,173,537 B1 | 5/2012 | Chattopadhyay et al. | |
| 8,178,443 B2 | 5/2012 | Rangarajan et al. | |
| 8,247,332 B2 | 8/2012 | Rangarajan et al. | |
| 8,669,181 B1 | 3/2014 | Yu et al. | |
| 8,846,525 B2 | 9/2014 | Rangarajan et al. | |
| 8,927,442 B1 | 1/2015 | Angyal et al. | |
| 9,234,276 B2 | 1/2016 | Varadarajan | |
| 9,337,068 B2 | 5/2016 | Antonelli et al. | |
| 9,371,579 B2 | 6/2016 | Varadarajan et al. | |
| 9,391,086 B1 | 7/2016 | Soda et al. | |
| 9,837,270 B1 | 12/2017 | Varadarajan et al. | |
| 10,002,787 B2 * | 6/2018 | Yu ..................... | H01L 21/76816 |
| 10,211,310 B2 | 2/2019 | Varadarajan et al. | |
| 10,297,442 B2 | 5/2019 | Varadarajan et al. | |
| 10,325,773 B2 | 6/2019 | Varadarajan et al. | |
| 2001/0021491 A1 | 9/2001 | Chen et al. | |
| 2002/0000202 A1 | 1/2002 | Yuda et al. | |
| 2002/0016085 A1 | 2/2002 | Huang et al. | |
| 2002/0019148 A1 | 2/2002 | Hawryluk et al. | |
| 2002/0024117 A1 | 2/2002 | Russell et al. | |
| 2002/0039625 A1 | 4/2002 | Powell et al. | |
| 2002/0106891 A1 | 8/2002 | Kim et al. | |
| 2002/0132101 A1 | 9/2002 | Fonash et al. | |
| 2003/0001275 A1 | 1/2003 | Sambucetti et al. | |
| 2003/0008528 A1 | 1/2003 | Xia et al. | |
| 2003/0036215 A1 | 2/2003 | Reid | |
| 2003/0049460 A1 | 3/2003 | O'Neill et al. | |
| 2003/0057553 A1 | 3/2003 | DelaRosa et al. | |
| 2003/0064154 A1 | 4/2003 | Laxman et al. | |
| 2003/0068881 A1 | 4/2003 | Xia et al. | |
| 2003/0082296 A1 | 5/2003 | Elers et al. | |
| 2003/0089992 A1 | 5/2003 | Rathi et al. | |
| 2003/0162033 A1 | 8/2003 | Johnson et al. | |
| 2003/0176030 A1 | 9/2003 | Tsuji et al. | |
| 2003/0194496 A1 | 10/2003 | Xu et al. | |
| 2003/0232150 A1 | 12/2003 | Arnold et al. | |
| 2003/0232514 A1 | 12/2003 | Kim et al. | |
| 2004/0067308 A1 | 4/2004 | Zheng et al. | |
| 2004/0084680 A1 | 5/2004 | Ruelke et al. | |
| 2004/0084774 A1 | 5/2004 | Li et al. | |
| 2004/0089924 A1 | 5/2004 | Yuasa et al. | |
| 2004/0113279 A1 | 6/2004 | Chen et al. | |
| 2004/0115954 A1 | 6/2004 | Todd | |
| 2004/0121085 A1 | 6/2004 | Wang et al. | |
| 2004/0124531 A1 | 7/2004 | Venkatraman et al. | |
| 2004/0161535 A1 | 8/2004 | Goundar et al. | |
| 2004/0178169 A1 | 9/2004 | Desphande et al. | |
| 2004/0194706 A1 | 10/2004 | Wang et al. | |
| 2004/0207084 A1 | 10/2004 | Hedrick et al. | |
| 2004/0232552 A1 | 11/2004 | Wang et al. | |
| 2005/0014361 A1 | 1/2005 | Nguyen et al. | |
| 2005/0042889 A1 | 2/2005 | Lee et al. | |
| 2005/0100682 A1 | 5/2005 | Fukiage et al. | |
| 2005/0202685 A1 | 9/2005 | Huang et al. | |
| 2005/0230831 A1 | 10/2005 | Clevenger et al. | |
| 2005/0233555 A1 | 10/2005 | Rajagopalan et al. | |
| 2005/0236711 A1 | 10/2005 | Wang et al. | |
| 2005/0245071 A1 | 11/2005 | Wu et al. | |
| 2005/0255714 A1 | 11/2005 | Iyer et al. | |
| 2005/0277302 A1 | 12/2005 | Nguyen et al. | |
| 2005/0287790 A1 | 12/2005 | Owada et al. | |
| 2005/0287811 A1 | 12/2005 | Inukai | |
| 2006/0014384 A1 | 1/2006 | Lee et al. | |
| 2006/0014399 A1 | 1/2006 | Joe | |
| 2006/0019486 A1 | 1/2006 | Yu et al. | |

(56) References Cited

U.S. PATENT DOCUMENTS

| | | |
|---|---|---|
| 2006/0040507 A1 | 2/2006 | Mak et al. |
| 2006/0046520 A1 | 3/2006 | Padhi et al. |
| 2006/0091559 A1 | 5/2006 | Nguyen et al. |
| 2006/0110931 A1 | 5/2006 | Fukazawa et al. |
| 2006/0160376 A1 | 7/2006 | Padhi et al. |
| 2006/0216916 A1 | 9/2006 | Tsai et al. |
| 2006/0252273 A1 | 11/2006 | Lakshmanan et al. |
| 2006/0273319 A1 | 12/2006 | Dairiki et al. |
| 2007/0004204 A1 | 1/2007 | Fukazawa et al. |
| 2007/0141812 A1 | 6/2007 | Zagwijn et al. |
| 2007/0166546 A1 | 7/2007 | Ichikawa et al. |
| 2007/0190266 A1 | 8/2007 | Fu |
| 2007/0232071 A1 | 10/2007 | Balseanu et al. |
| 2007/0264839 A1 | 11/2007 | Van Gompel et al. |
| 2007/0281496 A1 | 12/2007 | Ingle et al. |
| 2007/0281497 A1 | 12/2007 | Liu et al. |
| 2008/0050933 A1 | 2/2008 | Ozaki et al. |
| 2008/0063809 A1 | 3/2008 | Lee et al. |
| 2008/0064173 A1 | 3/2008 | Hung |
| 2008/0070396 A1 | 3/2008 | Budrevich et al. |
| 2008/0099754 A1 | 5/2008 | Enicks |
| 2008/0122103 A1 | 5/2008 | Bonilla et al. |
| 2008/0128907 A1 | 6/2008 | Yang et al. |
| 2008/0173984 A1 | 7/2008 | Lin et al. |
| 2008/0178805 A1 | 7/2008 | Paterson et al. |
| 2008/0217746 A1 | 9/2008 | Morita et al. |
| 2008/0233366 A1 | 9/2008 | Edelstein et al. |
| 2008/0254641 A1 | 10/2008 | Kobayashi et al. |
| 2008/0277765 A1 | 11/2008 | Lane et al. |
| 2009/0017227 A1 | 1/2009 | Fu et al. |
| 2009/0017640 A1 | 1/2009 | Huh et al. |
| 2009/0042402 A1 | 2/2009 | Morioka |
| 2009/0082240 A1 | 3/2009 | Nukui et al. |
| 2009/0215282 A1 | 8/2009 | Moore et al. |
| 2009/0218699 A1 | 9/2009 | Torres et al. |
| 2009/0258487 A1 | 10/2009 | Lin et al. |
| 2009/0294925 A1 | 12/2009 | Lin et al. |
| 2009/0325364 A1 | 12/2009 | Sasagawa et al. |
| 2010/0075077 A1 | 3/2010 | Bicker et al. |
| 2010/0081293 A1 | 4/2010 | Mallick et al. |
| 2010/0181654 A1 | 7/2010 | Fujiwara et al. |
| 2010/0207274 A1 | 8/2010 | Hayashi et al. |
| 2010/0255667 A1 | 10/2010 | Seino et al. |
| 2010/0308463 A1 | 12/2010 | Yu et al. |
| 2011/0027957 A1 | 2/2011 | Berry |
| 2011/0045676 A1 | 2/2011 | Park et al. |
| 2011/0074044 A1 | 3/2011 | Lin et al. |
| 2011/0111533 A1 | 5/2011 | Varadarajan et al. |
| 2011/0111590 A1 | 5/2011 | Edelstein et al. |
| 2011/0114994 A1 | 5/2011 | Mandlik et al. |
| 2011/0117678 A1 | 5/2011 | Varadarajan et al. |
| 2011/0135557 A1 | 6/2011 | Rangarajan et al. |
| 2011/0146568 A1 | 6/2011 | Haukka et al. |
| 2011/0180866 A1 | 7/2011 | Matsuda et al. |
| 2011/0193230 A1 | 8/2011 | Nogami et al. |
| 2011/0204492 A1 | 8/2011 | Xie et al. |
| 2012/0077349 A1 | 3/2012 | Li et al. |
| 2012/0122302 A1 | 5/2012 | Weidman et al. |
| 2012/0241089 A1 | 9/2012 | Dielmann et al. |
| 2012/0329287 A1 | 12/2012 | Gates et al. |
| 2013/0008378 A1 | 1/2013 | Antonelli et al. |
| 2013/0043514 A1 | 2/2013 | Grill et al. |
| 2013/0056818 A1 | 3/2013 | Iino et al. |
| 2013/0119406 A1 | 5/2013 | Notsu et al. |
| 2013/0129940 A1 | 5/2013 | Xiao et al. |
| 2013/0157466 A1 | 6/2013 | Fox et al. |
| 2013/0242493 A1 | 9/2013 | Shenoy et al. |
| 2013/0319290 A1 | 12/2013 | Xiao et al. |
| 2013/0330932 A1 | 12/2013 | Rangarajan et al. |
| 2013/0330935 A1 | 12/2013 | Varadarajan |
| 2014/0175617 A1 | 6/2014 | Antonelli et al. |
| 2014/0197470 A1 | 7/2014 | Lee et al. |
| 2014/0264780 A1 | 9/2014 | Yim et al. |
| 2014/0264925 A1 | 9/2014 | Chen |
| 2014/0302690 A1 | 10/2014 | Underwood et al. |
| 2014/0356549 A1 | 12/2014 | Varadarajan |
| 2015/0118394 A1 | 4/2015 | Varadarajan et al. |
| 2015/0179466 A1 | 6/2015 | Takayama et al. |
| 2015/0303056 A1 | 10/2015 | Varadarajan et al. |
| 2016/0020089 A1 | 1/2016 | Thadani et al. |
| 2016/0090649 A1 | 3/2016 | Varadarajan |
| 2016/0268286 A1 | 9/2016 | Tamura |
| 2016/0276140 A1 | 9/2016 | Varadarajan et al. |
| 2016/0284615 A1 | 9/2016 | Kitajima et al. |
| 2016/0314964 A1 | 10/2016 | Tang et al. |
| 2017/0365462 A1 | 12/2017 | Varadarajan et al. |
| 2018/0033614 A1* | 2/2018 | Chandra ............... C23C 16/345 |
| 2018/0096842 A1 | 4/2018 | Varadarajan |
| 2018/0144977 A1 | 5/2018 | Yu et al. |
| 2018/0330939 A1 | 11/2018 | Pore |
| 2018/0330945 A1 | 11/2018 | Varadarajan et al. |
| 2018/0347035 A1 | 12/2018 | Weimer et al. |
| 2019/0181004 A1 | 6/2019 | Tang et al. |

FOREIGN PATENT DOCUMENTS

| | | |
|---|---|---|
| CN | 1735945 A | 2/2006 |
| CN | 101017834 A | 8/2007 |
| CN | 101065834 A | 10/2007 |
| CN | 101111930 A | 1/2008 |
| CN | 101536191 A | 9/2009 |
| CN | 102171796 A | 8/2011 |
| CN | 102187450 A | 9/2011 |
| CN | 102468434 A | 5/2012 |
| CN | 102652353 A | 8/2012 |
| CN | 102892922 A | 1/2013 |
| EP | 1 172 845 A2 | 1/2002 |
| EP | 1 186 685 A2 | 3/2002 |
| JP | 10-092742 | 4/1998 |
| JP | 2001-160547 | 6/2001 |
| JP | 2002-176100 | 6/2002 |
| JP | 2002-217189 | 8/2002 |
| JP | 2004-247725 | 9/2004 |
| JP | 2005-051096 A | 2/2005 |
| JP | 2007-158000 | 6/2007 |
| JP | 2008-529296 | 7/2008 |
| KR | 10-2006-0134964 | 12/2006 |
| KR | 10-2009-0121361 | 11/2009 |
| KR | 10-1334640 B1 | 11/2013 |
| TW | 261689 B | 11/1995 |
| TW | 476807 B | 2/2002 |
| TW | 535253 B | 6/2003 |
| TW | 200405437 | 4/2004 |
| TW | 200600984 | 1/2006 |
| TW | 200803988 | 1/2008 |
| TW | 200839884 | 10/2008 |
| TW | 200903635 A | 1/2009 |
| TW | 200908138 | 2/2009 |
| TW | 201124553 A | 7/2011 |
| TW | 201214512 A1 | 4/2012 |
| TW | 201214563 A | 4/2012 |
| TW | 201240012 A1 | 10/2012 |
| TW | 201405659 A | 2/2014 |
| WO | WO 2007/116492 | 10/2007 |

OTHER PUBLICATIONS

U.S. Final Office Action dated May 14, 2015 issued in U.S. Appl. No. 13/907,699.

U.S. Advisory Action and Examiner Initiated Interview Summary dated Aug. 12, 2015 issued in U.S. Appl. No. 13/907,699

U.S. Notice of Allowance dated Sep. 10, 2015 issued in U.S. Appl. No. 13/907,699.

U.S. Office Action dated Feb. 5, 2018 issued in U.S. Appl. No. 14/961,637.

U.S. Office Action dated Sep. 15, 2015 issued in U.S. Appl. No. 14/062,648.

U.S. Notice of Allowance dated Feb. 19, 2016 issued in U.S. Appl. No. 14/062,648.

U.S. Office Action dated Nov. 2, 2015 issued in U.S. Appl. No. 14/616,435.

U.S. Final Office Action dated Mar. 10, 2016 issued in U.S. Appl. No. 14/616,435.

(56) References Cited

OTHER PUBLICATIONS

U.S. Office Action dated Jul. 8, 2016 issued in U.S. Appl. No. 14/616,435.
U.S. Final Office Action dated Feb. 22, 2017 issued in U.S. Appl. No. 14/616,435.
U.S. Examiner's Answer to the Appeal brief [filed May 19, 2017] before the Patent Trial and Appeal Board dated Sep. 22, 2017 issued in U.S. Appl. No. 14/616,435.
U.S. Office Action dated Sep. 12, 2016 issued in U.S. Appl. No. 14/692,627.
U.S. Final Office Action, dated May 19, 2017, issued in U.S. Appl. No. 14/692,627.
U.S. Office Action dated Nov. 8, 2017 issued in U.S. Appl. No. 14/692,627.
U.S. Office Action dated Dec. 29, 2017 issued in U.S. Appl. No. 15/283,159.
U.S. Office Action dated Jul. 7, 2017 issued in U.S. Appl. No. 15/382,137.
U.S. Notice of Allowance dated Sep. 22, 2017 issued in U.S. Appl. No. 15/382,137.
U.S. Office Action dated Feb. 24, 2005 issued in U.S. Appl. No. 10/670,660.
U.S. Notice of Allowance dated Sep. 11, 2006 issued in U.S. Appl. No. 11/234,808.
U.S. Office Action dated May 3, 2006 issued in U.S. Appl. No. 10/915,117.
U.S. Final Office Action dated Sep. 7, 2006 issued in U.S. Appl. No. 10/915,117.
U.S. Office Action dated Dec. 11, 2006 issued in U.S. Appl. No. 10/915,117.
U.S. Notice of Allowance dated Feb. 26, 2007 issued in U.S. Appl. No. 10/915,117.
U.S. Office Action dated May 1, 2008 issued in U.S. Appl. No. 11/373,847.
U.S. Notice of Allowance and Allowed Claims dated Jul. 1, 2008 issued in U.S. Appl. No. 11/373,847.
U.S. Office Action dated Apr. 10, 2009 issued in U.S. Appl. No. 11/805,356.
U.S. Final Office Action dated Oct. 13, 2009 issued in U.S. Appl. No. 11/805,356.
U.S. Office Action dated Apr. 8, 2010 issued in U.S. Appl. No. 11/805,356.
U.S. Notice of Allowance and Allowed Claims dated Jul. 26, 2010 issued in U.S. Appl. No. 11/805,356.
U.S. Office Action dated Sep. 6, 2006 issued in U.S. Appl. No. 10/869,474.
U.S. Office Action dated Feb. 9, 2007 issued in U.S. Appl. No. 10/869,474.
U.S. Final Office Action dated Jun. 28, 2007 issued in U.S. Appl. No. 10/869,474.
U.S. Notice of Allowance dated Jul. 26, 2007 issued in U.S. Appl. No. 10/869,474.
U.S. Office Action dated Mar. 17, 2008 issued in U.S. Appl. No. 11/893,490.
U.S. Office Action dated Aug. 8, 2008 issued in U.S. Appl. No. 11/893,490.
U.S. Office Action (Ex Parte Quayle) dated Jan. 27, 2009 issued in U.S. Appl. No. 11/893,490.
U.S. Notice of Allowance dated May 4, 2009 issued in U.S. Appl. No. 11/893,490.
U.S. Office Action dated Oct. 15, 2010 issued in U.S. Appl. No. 12/497,322.
U.S. Notice of Allowance and Allowed Claims dated Mar. 11, 2011 issued in U.S. Appl. No. 12/497,322.
U.S. Office Action dated Nov. 20, 2009 issued in U.S. Appl. No. 11/710,652.
U.S. Final Office Action dated Apr. 15, 2010 issued in U.S. Appl. No. 11/710,652.
U.S. Office Action dated Aug. 5, 2010 issued in U.S. Appl. No. 11/710,652.
U.S. Notice of Allowance and Allowed Claims dated Nov. 24, 2010 issued in U.S. Appl. No. 11/710,652.
U.S. Office Action dated Jul. 9, 2013 issued in U.S. Appl. No. 11/710,652.
U.S. Notice of Allowance dated Oct. 25, 2013 issued in U.S. Appl. No. 11/710,652.
U.S. Office Action dated Dec. 31, 2008 issued in U.S. Appl. No. 11/693,617.
U.S. Office Action dated Oct. 7, 2009 issued in U.S. Appl. No. 11/693,617.
U.S. Office Action dated Jun. 10, 2010 issued in U.S. Appl. No. 11/693,617.
U.S. Final Office Action dated Jan. 20, 2011 issued in U.S. Appl. No. 11/693,617.
U.S. Office Action dated Sep. 16, 2011 issued in U.S. Appl. No. 11/693,617.
U.S. Notice of Allowance dated Jan. 9, 2012 issued in U.S. Appl. No. 11/693,617.
U.S. Office Action dated Jan. 12, 2011 issued in U.S. Appl. No. 12/082,496.
U.S. Final Office Action dated Aug. 4, 2011 issued in U.S. Appl. No. 12/082,496.
U.S. Notice of Allowance dated Oct. 26, 2011 issued in U.S. Appl. No. 12/082,496.
U.S. Notice of Allowance dated Apr. 10, 2012 issued in U.S. Appl. No. 12/631,691.
U.S. Office Action dated Feb. 7, 2014 issued in U.S. Appl. No. 13/967,832.
U.S. Notice of Allowance dated May 30, 2014 issued in U.S. Appl. No. 13/967,832.
U.S. Notice of Allowance dated Sep. 5, 2014 issued in U.S. Appl. No. 13/967,832.
U.S. Office Action dated Sep. 29, 2015 issued in U.S. Appl. No. 14/105,026.
U.S. Notice of Allowance dated Jan. 29, 2016 issued in U.S. Appl. No. 14/105,026.
U.S. Office Action dated Feb. 7, 2014 issued in U.S. Appl. No. 13/494,836.
U.S. Final Office Action dated Aug. 21, 2014 issued in U.S. Appl. No. 13/494,836.
U.S. Office Action dated May 5, 2015 issued in U.S. Appl. No. 13/494,836.
U.S. Final Office Action dated Nov. 16, 2015 issued in U.S. Appl. No. 13/494,836.
U.S. Office Action dated Mar. 10, 2016 issued in U.S. Appl. No. 13/494,836.
U.S. Final Office Action dated Jul. 11, 2016 issued in U.S. Appl. No. 13/494,836.
U.S. Office Action dated Jan. 9, 2017 issued in U.S. Appl. No. 13/494,836.
U.S. Examiner's Answer to the Appeal brief [filed Apr. 28, 2017] before the Patent Trial and Appeal Board dated Sep. 25, 2017 issued in U.S. Appl. No. 13/494,836.
Taiwan Office Action dated Nov. 6, 2017 issued in Application No. TW 103119100.
Singapore Notice of Allowance & Supplemental Exam Report dated Nov. 30, 2017 issued in Application No. SG 10201402381U.
Chinese First Office Action dated Sep. 5, 2016 issued in Application No. CN 201410576747.1.
Chinese First Office Action dated Jan. 3, 2018 issued in Application No. CN 201610084166.5.
Chinese First Office Action dated Jan. 24, 2014 issued in Application No. CN 201010569747.0.
Chinese Second Office Action dated Aug. 14, 2014 issued in Application No. CN 201010569747.0.
Chinese Third Office Action dated Jan. 13, 2015 issued in Application No. CN 201010569747.0.
Chinese First Office Action dated Jul. 3, 2017 issued in Application No. CN 201510566292.X.
Japanese Office Action dated Jul. 29, 2014 issued in Application No. JP 2010-256165.
Korean Office Action dated Feb. 20, 2017 issued in Application No. KR 10-2010-0123145.

(56) References Cited

OTHER PUBLICATIONS

Korean First Office Action dated Feb. 1, 2018 issued in Application No. KR 10-2017-0147917.
Taiwan Notice of Allowance and Search Report dated Jul. 8, 2015 issued in Application No. TW 099140866.
Taiwan Office Action dated Jan. 14, 2016 issued in Application No. TW 104126278.
Taiwan Examination Report dated Mar. 14, 2017 issued in Application No. TW 102146997.
Taiwan Examination Report dated Aug. 8, 2017 issued in Application No. TW 102146997.
Taiwan Office Action dated Dec. 22, 2015 issued in Application No. TW 102120742.
PCT International Search Report and Written Opinion (ISA/KR) dated Dec. 26, 2017 issued in PCT/US2017/051794.
PCT International Search Report and Written Opinion (ISA/KR) dated Mar. 15, 2018 issued in PCT/US2017/062882.
PCT International Search Report and Written Opinion (ISA/KR) dated Mar. 19, 2018 issued in PCT/US2017/064024.
Benilan et al., (Oct. 4, 2011) "Optimization of microwave Hydrogen plasma discharges to mimic Lyman α(121.6 nm) solar irradiations," EPSC-DPS2011-1317, *EPSC-DPJ Joint Meeting 2011, EPSC Abstracts*, 6:2pp.
"Development of Current Atomic Theory," Emission Spectrum of Hydrogen, [downloaded at http://chemed.chem.purdue.edu/genchem/topicreview/bp/ch6/bohr.html on Sep. 23, 2015], 7 pp.
"Dummies' Guide to Hydrogen," *Molecular Hydrogen Foundation, MHF*, [downloaded at http://www.molecularhydrogenfoundation.org/core-information/dummies-guide-to-hydrogen on Sep. 23, 2015], 2 pp.
Fozza et al., (Jan./Feb.1998) "Vacuum ultraviolet to visible emission of some pure gases and their mixtures used for plasma processing," *J. Vac. Sci. Technol. A*, American Vacuum Society, 16(1):72-77.
Grubbs et al. (May/Jun. 2006) "Attenuation of hydrogen radicals traveling under flowing gas conditions through tubes of different materials," *J. Vac. Sci. Technol. A*, 24(3):486-496.
Hatanaka et al., (2000) "Experiments and analyses of SiC thin film deposition from organo-silicon by a remote plasma method," *Thin Solid Films*, 368:287-291.
Huran, J., et al., (2004) "RBS study of amorphous silicon carbide films deposited by PECVD," *Czechoslovak Journal of Physics*, 54(Suppl. C):C1006-C1010.
Jones et al., (Nov. 30, 2001) "Silicon Containing Polymers: The Science and Technology of Their Synthesis and Applications," *Springer*, p. 705.
Lemaire, P.J., Walker, K.L., Kranz, K.S., Huff, R.G. and DiMarcello, F.V., (1990)."Diffusion of Hydrogen Through Hermetic Carbon Films on Silica Fibers," AT&T Bell Laboratories, 600 Mountain Avenue, Murray Hill, NJ 07974, *Mat. Res. Soc. Symp. Proc.* vol. 172, 12 pages, © 1990 Materials Research Society.
Maeda et al. (Sep. 1989), "A Low-Permittivity Interconnection Using an SiBN Interlayer," *IEEE Transactions on Electron Devices* 36(9).
"Radical (chemistry)" From Wikipedia, the free encyclopedia, [downloaded at.http://en.wikipedia.org/wiki/Radical_(chemistry) on Sep. 23, 2015), 11 pages.
Sugino, Takashi et al. (2001), "Synthesis of boron nitride film with low dielectric constant for its application to silicon ultralarge scale integrated semiconductors," *Diamond and Related Materials*, pp. 1275-1379, Elsevier Science B.V.
Wróbel et al. (2001) "Oligomerization and Polymerization Steps in Remote Plasma Chemical Vapor Deposition of Silicon-Carbon and Silica Films from Organosilicon Sources," *Chem. Mater*, 13(5):1884-1895.
Wróbel et al., (2010) "Reactivity of Organosilicon Precursors in Remote Hydrogen Microwave Plasma Chemical Vapor Deposition of Silicon Carbide and Silicon Carbonitride Thin-Film Coatings," *Appl. Organometal. Chem.*, 24:201-207.
Wu et al. (Oct. 17-19, 2006), "Ultra Low k Dielectrics Prepared by PECVD Using a Single-Precursor and Treated by UV Assisted Thermal Processing," *Advanced Metallization Conference (AMC)* 2006, pp. 1-6, San Diego, CA.
Xu, Ying-Yu, et al., (1999) "Preparation of SiC Thin Film Using Organosilicon by Remote Plasma CVD Method," *Mat. Res. Soc. Symp. Proc.*, 544:185-189.
U.S. Appl. No. 11/693,661, filed Mar. 29, 2007, Wu et al.
U.S. Final Office Action dated Nov. 5, 2010 issued in U.S. Appl. No. 11/693,661.
U.S. Office Action dated Aug. 28, 2009 issued in U.S. Appl. No. 11/693,661.
U.S. Office Action dated Feb. 24, 2010 issued in U.S. Appl. No. 11/693,661.
U.S. Final Office Action dated Aug. 28, 2018 issued in U.S. Appl. No. 14/961,637.
U.S. Office Action dated Jan. 29, 2019 issued in U.S. Appl. No. 14/961,637.
U.S. Notice of Allowance dated Jun. 18, 2019 issued in U.S. Appl. No. 14/961,637.
U.S. Office Action dated Nov. 16, 2018 issued in U.S. Appl. No. 15/169,530.
U.S. Final Office Aciton dated Mar. 5, 2019 issued in U.S. Appl. No. 15/169,530.
U.S. Notice of Allowance dated Feb. 4, 2019 issued in U.S. Appl. No. 14/616,435.
U.S. Final Office Action dated May 16, 2018 issued in U.S. Appl. No. 14/692,627.
U.S. Office Action dated Aug. 29, 2018 issued in U.S. Appl. No. 15/283,159.
U.S. Notice of Allowance dated Jan. 7, 2019 issued in U.S. Appl. No. 15/283,159.
U.S. Notice of Allowance dated Feb. 7, 2018 issued in U.S. Appl. No. 15/408,291.
U.S. Office Action dated Jul. 28, 2017 issued in U.S. Appl. No. 15/408,291.
U.S. Notice of Allowance dated Oct. 2, 2018 issued in U.S. Appl. No. 13/494,836.
U.S. Office Action dated Jan. 28, 2019 issued in U.S. Appl. No. 15/969,045.
U.S. Final Office Action dated Aug. 6, 2019 issued in U.S. Appl. No. 15/969,045.
Taiwan Notice of Allowance dated Jan. 8, 2019 issued in Application No. TW 107126975.
Chinese First Office Action dated Dec. 20, 2018 issued in Application No. CN 201710307116.3.
Chinese Second Office Action dated Jun. 3, 2019 issued in Application No. CN 201710307116.3.
Taiwan Notice of Allowance and Search Report dated Jun. 14, 2018 issued in Application No. TW 103136697.
Taiwan First Office Action dated Dec. 24, 2018 issued in Application No. TW 107123391.
Taiwan Second Office Action dated Apr. 18, 2019 issued in Application No. TW 107123391.
Chinese Second Office Action dated Oct. 12, 2018 issued in Application No. CN 201610084166.5.
Chinese Third Office Action dated Apr. 22, 2019 issued in Application No. CN 201610084166.5.
Taiwan First Office Action dated Jul. 30, 2019 issued in Application No. TW 105103396.
Chinese First Office Action dated Jun. 25, 2018 issued in Application No. CN 201610251266.2.
Chinese Second Office Action [Decision of Final Rejection] dated Jan. 25, 2019 issued in Application No. CN 201610251266.2.
PCT International Preliminary Report on Patentability (ISA/KR) dated Jun. 6, 2019 issued in PCT/US2017/062882.
PCT International Preliminary Report on Patentability (ISA/KR) dated Jun. 27, 2019 issued in PCT/US2017/064024.
Korean First Office Action dated Aug. 9, 2019 issued in Application No. KR 102120742 (No translation).
PCT International Preliminary Report on Patentability dated Apr. 11, 2019 (ISA/KR) dated Apr. 11, 2019 issued in PCT/US2017/051794.

(56) References Cited

OTHER PUBLICATIONS

Blaszczyk-Lezak et al., (2005) "Silicon Carbonitride Films Produced by Remote Hydrogen Microwave Plasma CVD Using a (Dimethylamino)dimethylsilane Precursor," *Chemical Vapor Deposition*, 11(1):44-52.
Coates et al., (1968) "Organometallic compounds of elements of main groups IV and V," *Principles of Organometallic Chemistry*.
U.S. Appl. No. 16/041,153, filed Jul. 20, 2018, Weimer et al.
U.S. Appl. No. 16/240,133, filed Jan. 4, 2019, Varadarajan.
U.S. Appl. No. 16/400,320, filed May 1, 2019, Varadarajan et al.
U.S. Office Action dated Jul. 9, 2019 issued in U.S. Appl. No. 16/041,153.

\* cited by examiner

100

102
101
102
101
102
101
102
101
102
101
100

STAIRCASE ENCAPSULATION IN 3D NAND FABRICATION

CROSS-REFERENCE TO RELATED APPLICATION

This application is a continuation of U.S. patent application Ser. No. 15/408,291, filed on Jan. 17, 2017, and titled "STAIRCASE ENCAPSULATION IN 3D NAND FABRICATION," which claims benefit of U.S. Provisional Patent Application No. 62/426,035, filed Nov. 23, 2016, and titled "STAIRCASE ENCAPSULATION IN 3D NAND FABRICATION," and U.S. Provisional Patent Application No. 62/435,500, filed Dec. 16, 2016, and titled "STAIRCASE ENCAPSULATION IN 3D NAND FABRICATION," which are incorporated by reference herein in their entireties and for all purposes.

BACKGROUND

Semiconductor device fabrication involves fabrication of flash memory. As devices shrink, structures for fabricating efficient and multiple memory cells are used to maximize density of memory cells in a memory device. 3D NAND technology addresses challenges associated with two-dimensional NAND technology by stacking memory cells vertically in layers.

SUMMARY

Methods and apparatuses for processing semiconductor substrates are provided herein. One aspect involves a method of processing a semiconductor substrate for fabricating a 3D NAND structure, the method including: providing a substrate having alternating first oxide and nitride layers in a staircase pattern; prior to depositing a second oxide over the staircase pattern, depositing a carbon-containing encapsulation layer to encapsulate both the first oxide and nitride layers.

In various embodiments, the dry etch selectivity of the second oxide to the carbon-containing encapsulation layer is between about 2:1 and about 100:1.

The carbon-containing encapsulation layer may be deposited to a thickness between about 1 nm and about 250 nm.

In various embodiments, the carbon-containing encapsulation layer includes material selected from the group consisting of silicon carbide, oxygen-doped silicon carbide, nitrogen-doped silicon carbide, boron-and-nitrogen-doped silicon carbide, and combinations thereof.

In various embodiments, the carbon-containing encapsulation layer is deposited by introducing a silicon-containing and carbon-containing precursor; introducing a source gas in a plasma source remote from a chamber housing the substrate; generating one or more radicals of the source gas in the plasma source from the source gas; and introducing the one or more radicals of the source gas onto the substrate, wherein all or substantially all of the one or more radicals of the source gas are in a substantially low energy state that react with the silicon-containing and carbon-containing precursor to form the carbon-containing encapsulation film.

In some embodiments, the carbon-containing encapsulation layer is deposited by atomic layer deposition. In some embodiments, the carbon-containing encapsulation layer is deposited by chemical vapor deposition.

In some embodiments, the carbon-containing encapsulation layer prevents degradation at an interface between the first oxide and the second oxide.

In various embodiments, each of the first oxide layers and nitride layers is between about 10 nm to about 100 nm in thickness.

The staircase includes steps, each step including one oxide and one nitride layer, wherein each step includes a pad extending outward from the edge of an adjacent overlying step having a width of about 150 nm to about 1000 nm.

In various embodiments, the method also includes: after depositing the carbon-containing encapsulation layer, depositing the second oxide over the staircase pattern; etching a vertical slit in the staircase pattern; selectively etching the nitride layers relative to the first oxide, second oxide, and carbon-containing encapsulation layer to form gaps between the first oxide layers; depositing tungsten in the gaps between the first oxide layers to form tungsten wordlines; etching the second oxide to form vertical vias in the second oxide to the tungsten word lines, wherein the second oxide is etched selective to the carbon-containing encapsulation layer; etching the encapsulation layer selective to the first oxide, the second oxide, and the tungsten wordlines to expose the tungsten word lines at bottoms of the vias; and depositing tungsten in the vias to form tungsten interconnects to the tungsten wordlines.

In some embodiments, the vertical vias include vias having different depths. The vertical vias may have a critical dimension between about 50 nm and about 500 nm. The depths may range from between about 1 micron to about 12 microns.

In some embodiments, the first oxide layer is deposited at a deposition temperature different from that of a deposition temperature for depositing the second oxide.

Another aspect involves an apparatus for depositing a carbon-containing encapsulation film on a substrate to fabricate a 3D NAND structure, the apparatus including: a reaction chamber including the substrate; a plasma source coupled to the reaction chamber and configured to generate a plasma outside the reaction chamber; one or more first gas inlets coupled to the reaction chamber; a second gas inlet coupled to the reaction chamber; and a controller including instructions for performing the following operations: introducing a silicon-containing and carbon-containing precursor; introducing a source gas in a plasma source remote from a chamber housing the substrate; generating one or more radicals of the source gas in the plasma source from the source gas; and introducing the one or more radicals of the source gas onto the substrate, whereby all or substantially all of the one or more radicals of the source gas are in a substantially low energy state that react with the silicon-containing and carbon-containing precursor to form the carbon-containing encapsulation film.

These and other aspects are described further below with reference to the drawings.

DETAILED DESCRIPTION

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The implementations disclosed below describe deposition of a material on a substrate such as a wafer, substrate, or other work piece. The work piece may be of various shapes, sizes, and materials. In this application, the terms "semiconductor wafer," "wafer," "substrate," "wafer substrate," and "partially fabricated integrated circuit" are used interchangeably.

Semiconductor fabrication often involves fabrication of memory devices. One example is fabrication of a 3D NAND structure. However, existing techniques for forming 3D NAND structures are limited for scaling to smaller devices and patterning techniques can cause unwanted degradation of components in the structure. One technique for forming 3D NAND structures is shown in FIG. 1.

Figure 1:
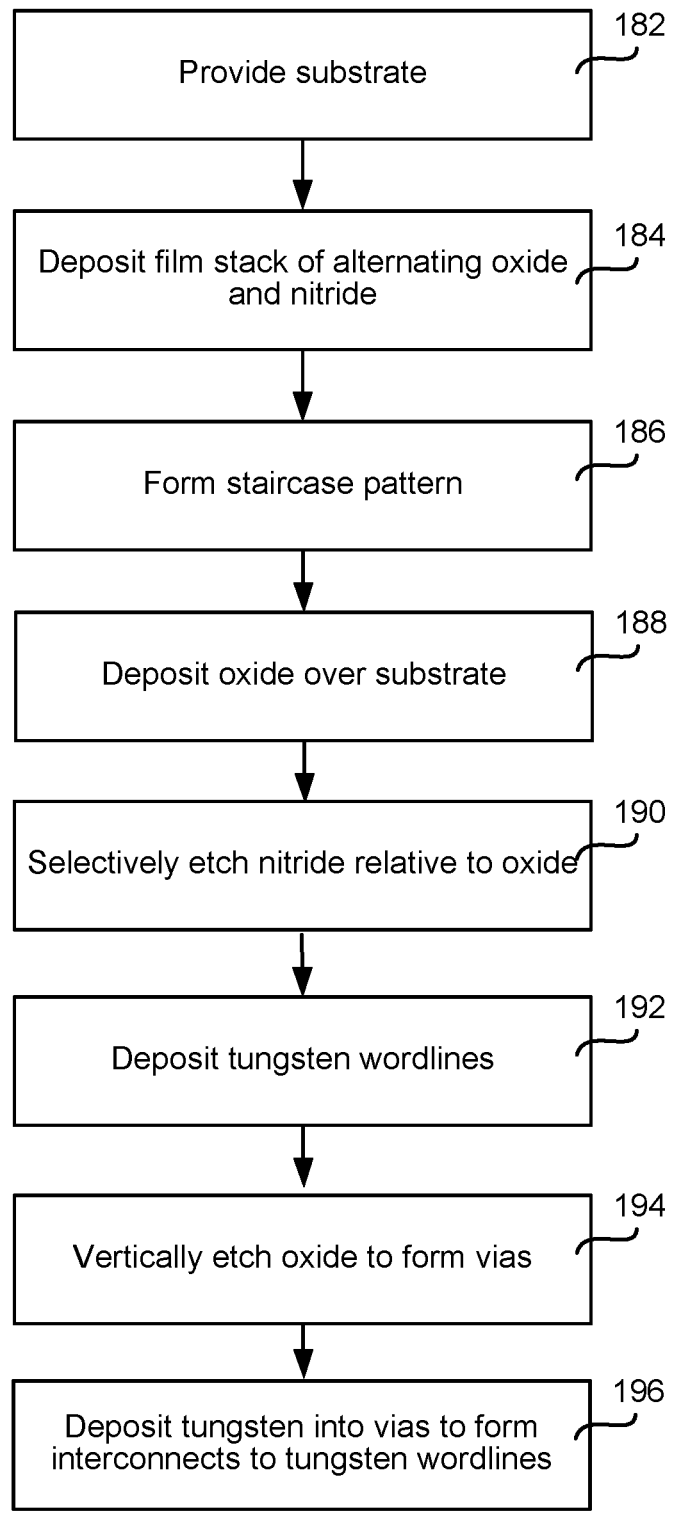
FIG. 1 is a process flow diagram depicting operations for a method.
Figure 2:
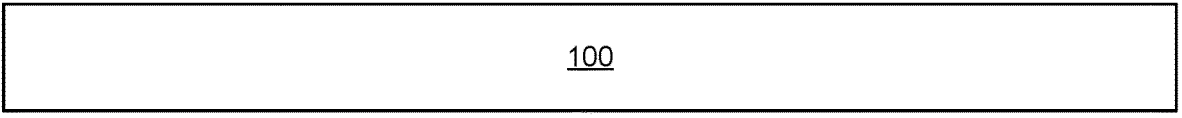
FIGS. 2, 3, and 4A are schematic illustrations of a substrate in a patterning scheme.

FIG. 1 shows a process flow diagram of operations performed in accordance with a method for forming a 3D NAND structure. In operation 182, a substrate is provided. In various embodiments, the substrate is a semiconductor substrate. The substrate may be a silicon wafer, e.g., a 200-mm wafer, a 300-mm wafer, or a 450-mm wafer, including wafers having one or more layers of material, such as dielectric, conducting, or semi-conducting material deposited thereon. An example substrate 100 is provided as a schematic illustration in FIG. 2.

Returning to FIG. 1, in operation 184, a film stack of alternating oxide and nitride films is deposited on the substrate. In various embodiments, the oxide layer deposited is a silicon oxide layer. In various embodiments, the nitride layer deposited is a silicon nitride layer.

Each oxide and nitride layer is deposited to about the same thickness, such as between about 10 nm and about 100 nm, or about 350 Å in some embodiments. The oxide layers may be deposited at a deposition temperature of between about room temperature and about 600° C. It will be understood that "deposition temperature" (or "substrate temperature) as used herein refers to the temperature that the pedestal holding the substrate is set to during deposition.

Oxide and nitride layers for forming the alternating oxide and nitride film stack may be deposited using any suitable technique, such as atomic layer deposition (ALD), plasma enhanced atomic layer deposition (PEALD), chemical vapor deposition (CVD), plasma enhanced chemical vapor deposition (PECVD), or sputtering. In various embodiments, the oxide and nitride layers are deposited by PECVD.

The film stack may include between 48 and 512 layers of alternating oxide and nitride layers, whereby each oxide or nitride layer constitutes one layer. The film stack including the alternating oxide and nitride layers may be referred to as an ONON stack.

Figure 3:
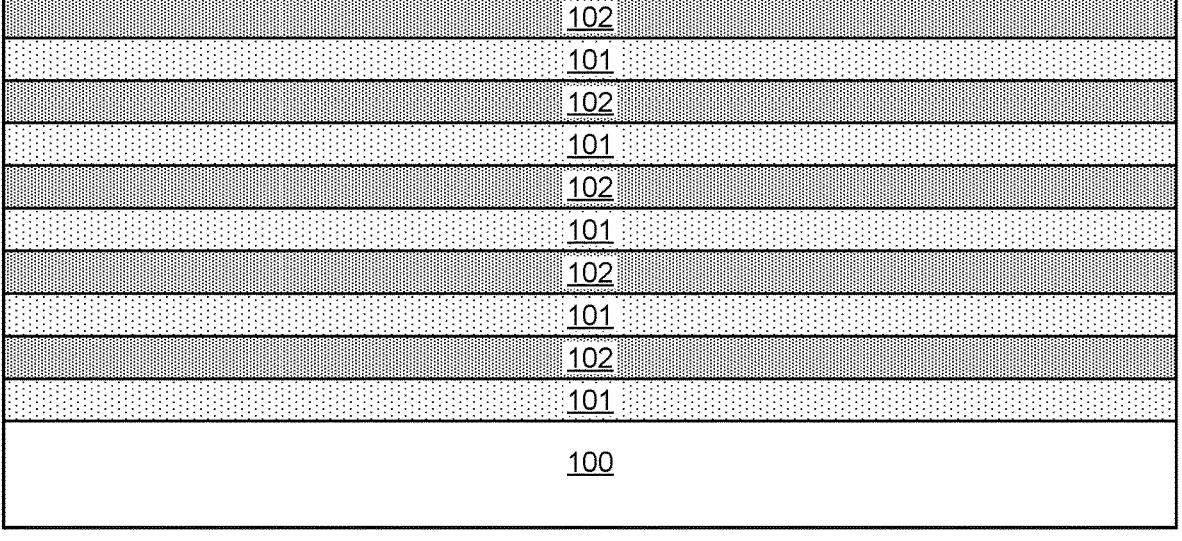

FIG. 3 shows an example schematic illustration of a substrate 100 with alternating oxide (101) and nitride (102) films deposited on the substrate 100. Note that while the structure shown in FIG. 3 shows an oxide deposited first, followed by nitride, oxide, nitride, etc., nitride may be deposited first, followed by oxide, nitride, oxide, etc.

Following deposition of the ONON stack, channels (not shown in FIG. 3) may be etched in the substrate. Subsequently, referring to FIG. 1, in operation 186, a staircase pattern is formed on the substrate. A "staircase pattern" as referred to herein includes two or more steps, each step including an oxide and a nitride layer. It will be understood that the top layer of each set of oxide and nitride layers may be either an oxide or a nitride for formation of steps in a staircase. In various embodiments, the staircase pattern includes between 24 and 256 steps. The staircase pattern may be formed using a variety of patterning techniques. For example, one technique may include depositing a sacrificial layer over the substrate and masking regions of the substrate to etch each set of oxide and nitride layers to form the staircase.

Figure 4A:
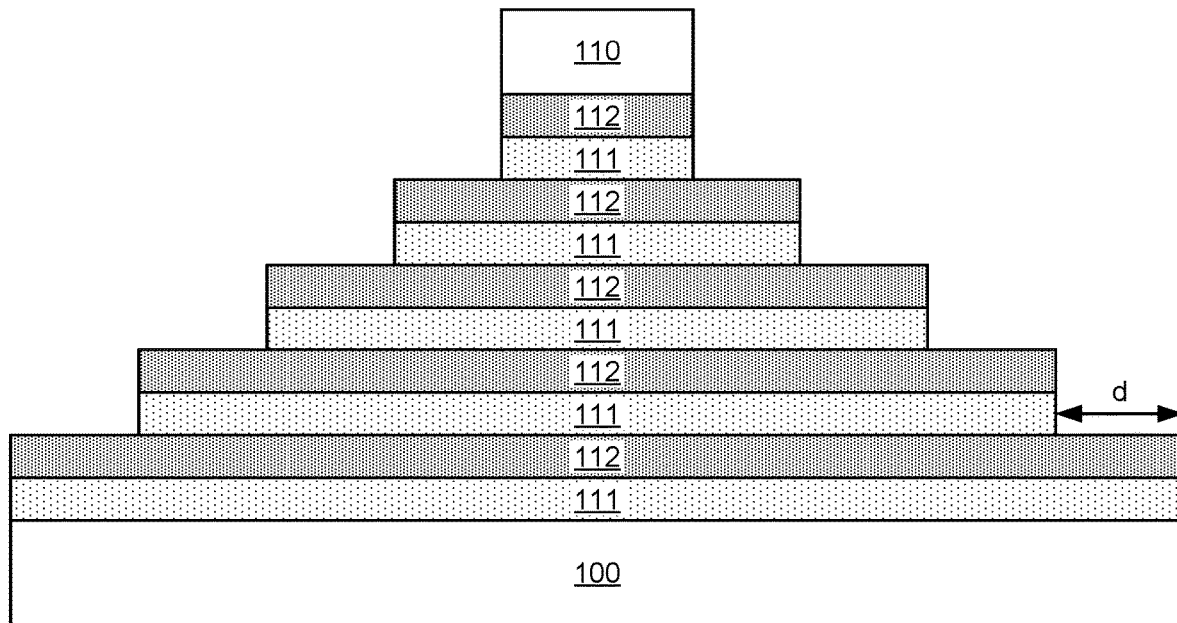

FIG. 4A provides an example of a substrate 100 including a staircase pattern of oxide (111) and nitride (112) layers with a hardmask 110 over the topmost nitride layer. Although FIG. 4A shows four steps of a staircase pattern, it will be understood that a staircase pattern may have between 24 and 256 steps. Each step includes a nitride and oxide layer, and distance as shown in FIG. 4A may be between about 150 nm and about 1000 nm, such as about 500 nm. This region of each step extending out from the edge of the step above it may be referred to as a "pad."

Figure 4B:
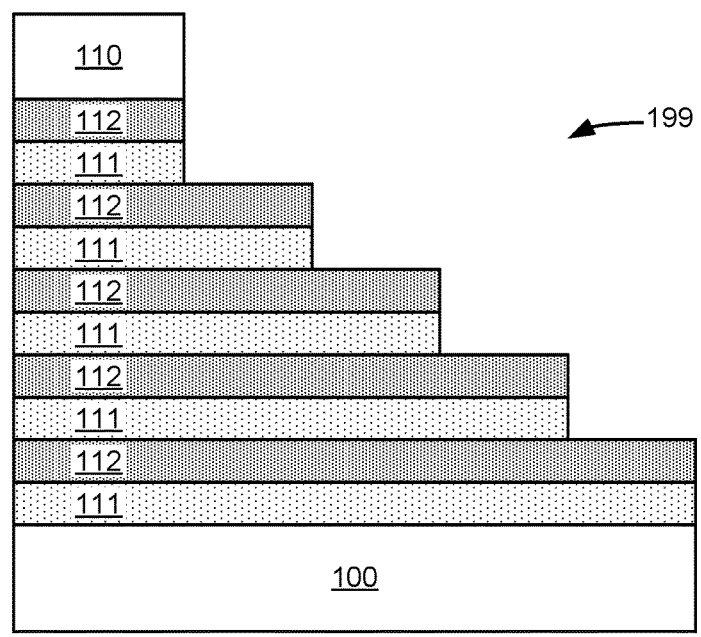
FIG. 4B is a half view of the substrate in FIG. 4A.

For purposes of discussion, the following discussion and subsequent schematic illustrations of the substrate will include a half view 199 as shown in FIG. 4B.

In operation 188 of FIG. 1, oxide is deposited over the substrate. In various embodiments, the oxide may be the same composition as the oxide deposited in layers of the ONON stack. In various embodiments, the oxide deposited over the substrate is deposited at a different deposition temperature than the deposition temperature used for depositing the oxide layers in the ONON stack. The deposition temperature may be between room temperature and about 600° C. Vertical slits may be subsequently etched into the substrate after depositing oxide.

Figure 5A:
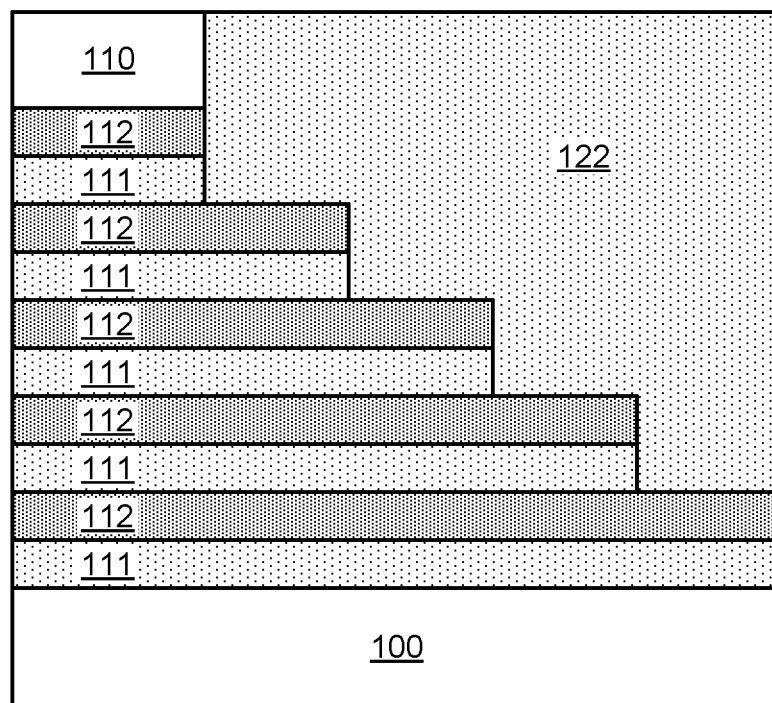
FIGS. 5A, 6A, 7A, 8, and 9 are schematic illustrations of a substrate in a patterning scheme.
Figure 5B:
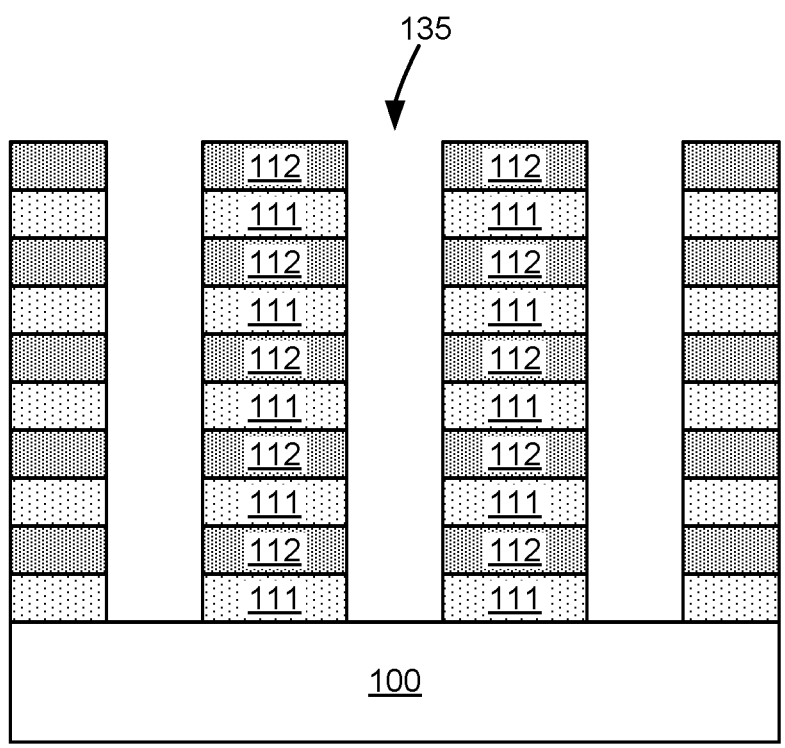
FIGS. 5B, 6B, and 7B are side views of schematic illustrations of substrates depicted in FIGS. 5A, 6A, and 7A, respectively.

FIG. 5A shows an example substrate 100 including the ONON staircase, hardmask 110, and oxide 122 deposited over the substrate. FIG. 5B shows a side view of the substrate 100 after vertical slits 135 are etched.

Figure 6A:
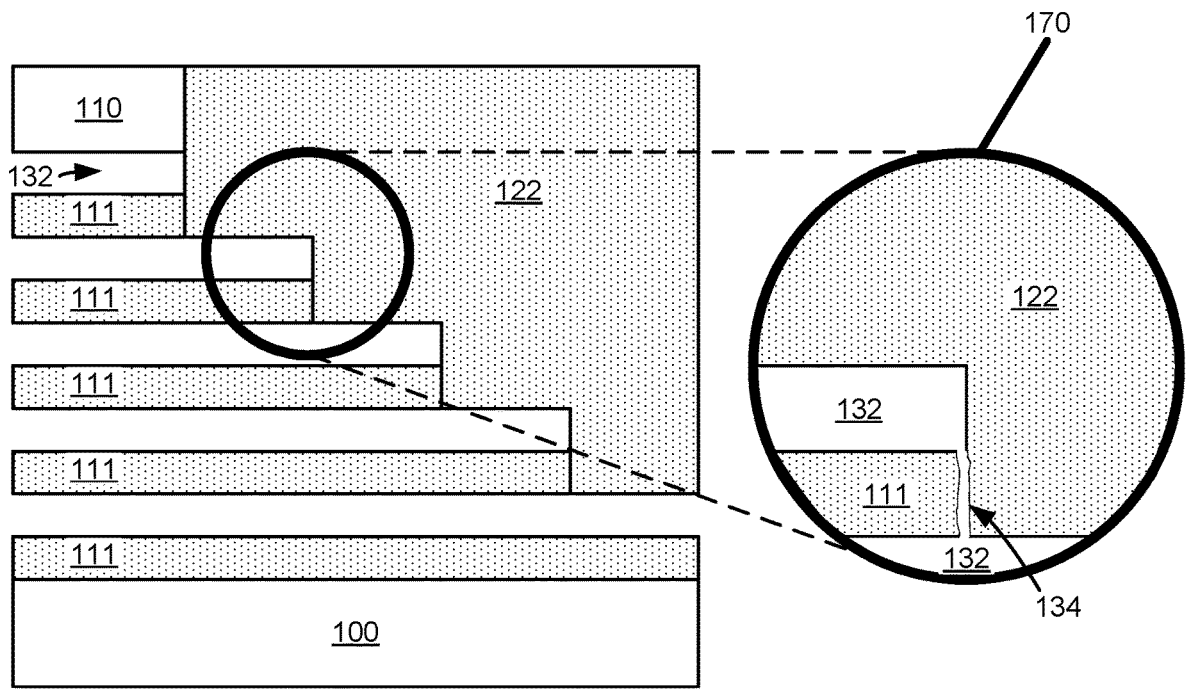
Figure 6B:
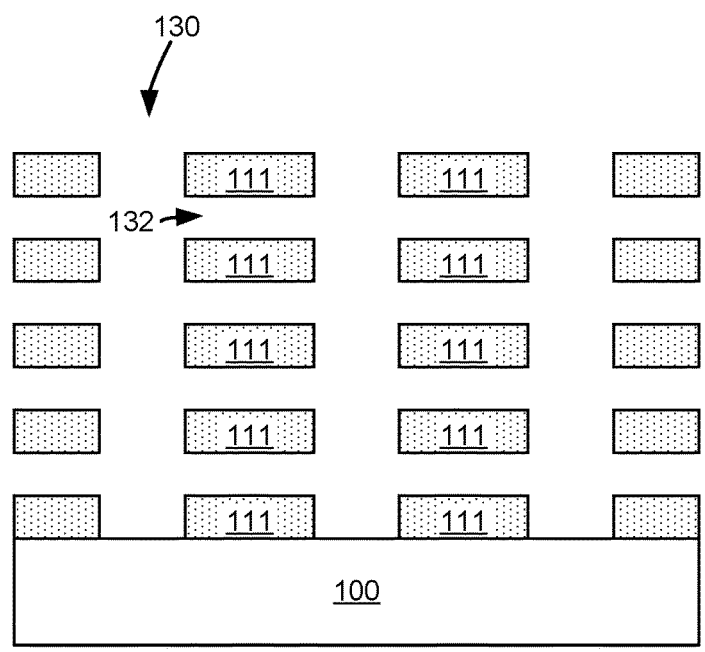

In operation 190, nitride is selectively etched relative to oxide on the substrate. Etching may be performed using a selective dry etch process, such as by exposing the substrate to any one or more of the following gases: chlorine ($Cl_2$), oxygen ($O_2$), nitrous oxide ($N_2O$), tetrafluoromethane ($CF_4$), sulfur tetrafluoride ($SF_4$), carbon dioxide ($CO_2$), fluoromethane ($CH_3F$), nitrogen trifluoride ($NF_3$), nitrogen ($N_2$), hydrogen ($H_2$), ammonia ($NH_3$), methane ($CH_4$), sulfur hexafluoride ($SF_6$), argon (Ar), carbonyl sulfide (COS), carbon disulfide ($CS_2$), hydrogen sulfide ($H_2S$), and nitric oxide (NO). This operation removes the nitride layers from the ONON stack such that etch species flow into the vertical slit and selectively etches nitride. It will be understood that the selective etching involves etching a first material at a rate faster than etching a second material. For example, selectively etching nitride relative to oxide means nitride is etched at a faster rate than etching of oxide. Nitride is selectively etched using a wet etch process, such as by exposing the substrate to phosphoric acid ($H_3PO_4$) and/or diluted hydrofluoric acid ("DHF") or a mixture of these solutions. However, conventional techniques for selectively removing nitride pose a risk for degradation and removal of oxide material at various interfaces, such as at the oxide-oxide interface at the end of each staircase. FIG. 6A shows an example schematic illustration of a substrate 100 with horizontal gaps 132 formed from etching nitride, but as shown in the zoomed-in view depicted in the circle at 170, a gap 134 forms at the oxide-oxide interface due to the etching species flowing into the gaps 132 and etching away at the oxide during the etching operation. FIG. 6B shows a side view of a cross-section of the substrate whereby gaps 132 are formed from selectively etching nitride.

Figure 7A:
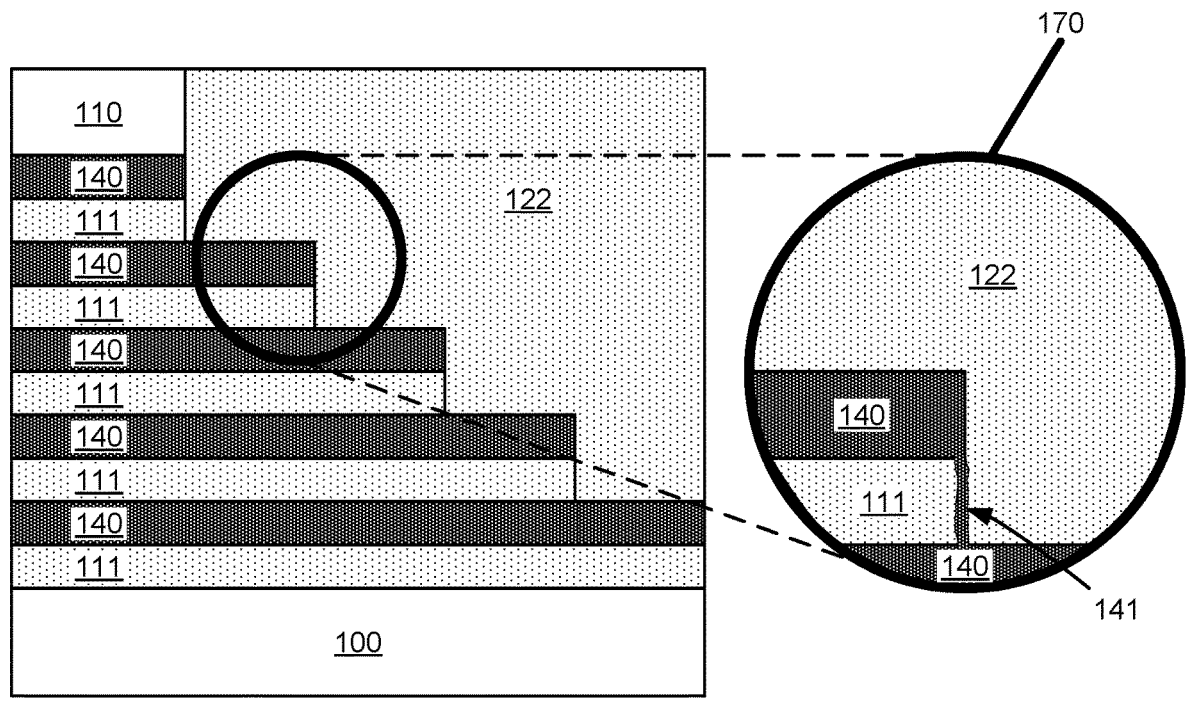
Figure 7B:
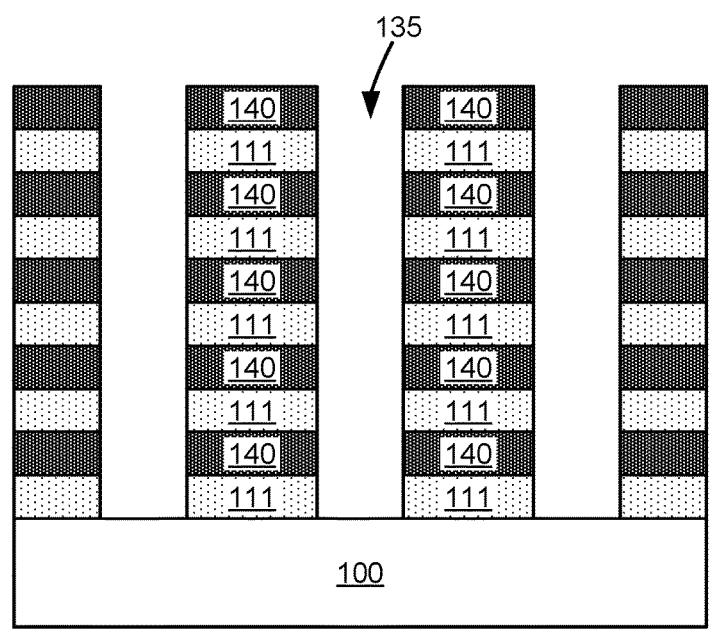

In operation 192, tungsten is deposited into the gaps of the substrate to form tungsten wordlines. Tungsten may be deposited by any suitable technique, such as ALD, CVD, PEALD, and/or PECVD. In some embodiments, a barrier layer and/or a tungsten nucleation layer is deposited prior to depositing bulk tungsten. FIG. 7A shows an example of a substrate 100 including deposited tungsten wordlines 140. However, due to the degradation of the oxide at the oxide-oxide interface as shown in the zoomed-in view at 170, tungsten fills in the gap at 141, thereby connecting two wordlines which can cause a short. FIG. 7B shows a schematic illustration of the substrate in 7A at a cross-section from a side view with tungsten wordlines 140 deposited in the gaps where nitride was previously.

Figure 8:
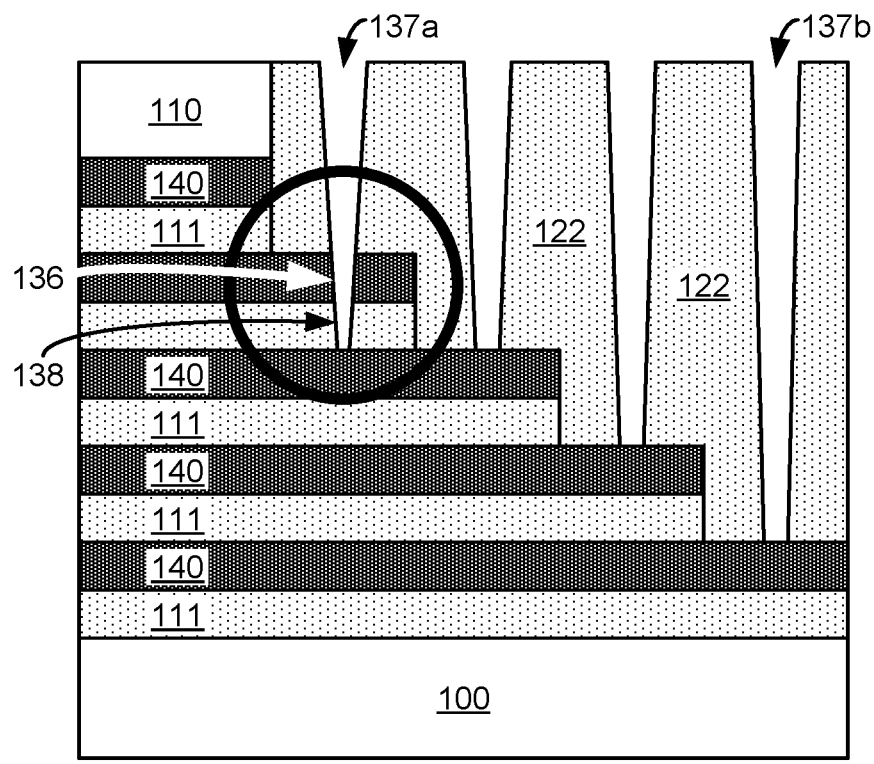

Returning to FIG. 1, in operation 194, the oxide is vertically etched to form vias. The oxide may be etched by dry etching using exposure to one or more of the following gases: $O_2$, Ar, $C_4F_6$, $C_4F_8$, $SF_6$, $CHF_3$, and $CF_4$. FIG. 8 shows an example substrate 100 including the ONON stack in a staircase pattern whereby vias 137 are etched in the oxide 122. However, because of the thinness of the tungsten wordline layer and the duration used to ensure vertical etching of the oxide is sufficient to etch the deepest vias (e.g., 137b), etching species flows into the vias (e.g., 137a) that are etched for the shallow parts of the oxide, thereby etching through the tungsten layer (136) and even etching through another oxide layer (138). This causes contact punchthrough or breakthrough to the layers below.

Figure 9:
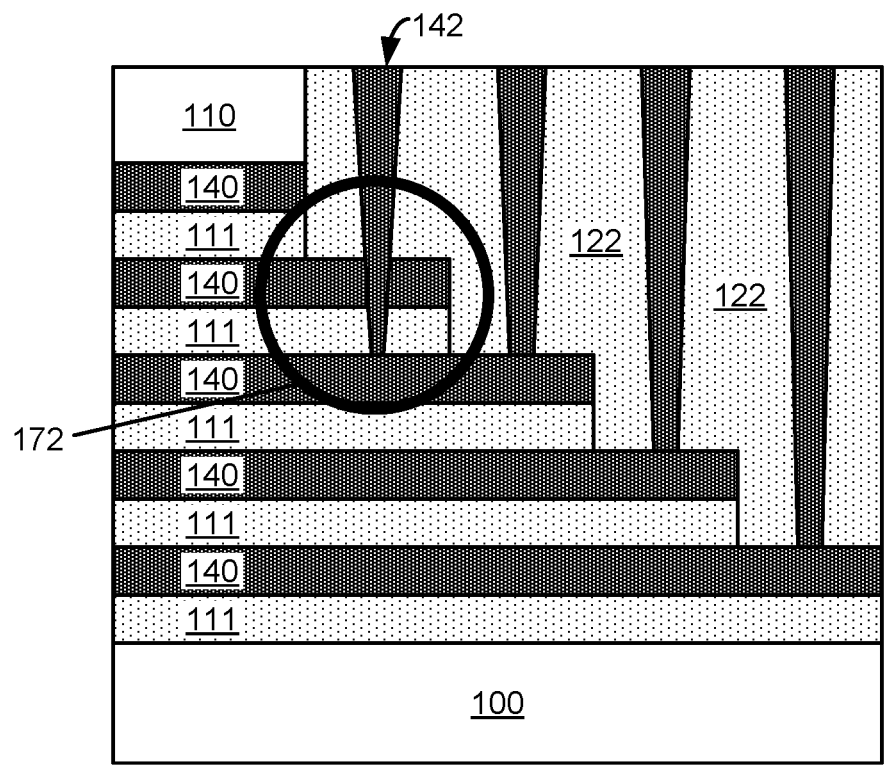

In FIG. 1, in operation 196, tungsten is deposited in the vias to form interconnects to the tungsten wordlines. However, as shown in FIG. 9, since the shallow vias caused breakthrough to the layers below due to the duration used to etch the deep vias, tungsten fills the vias (see filled tungsten via 142) and causes a short as circled in 172 of FIG. 9. Vias vary in depth and may have a depth between about 1 micron and about 12 microns. Shallow vias may be defined as having a depth less than 3.0 microns, such as between about 1.5 microns and 3.0 microns. Deep vias may have a depth greater than 3.0 microns. The critical dimension of vias formed in the oxide may be between about 50 nm and about 500 nm. Vias may be etched using a dry etch process which may involve masking operations to pattern the oxide.

Conventional techniques for forming 3D NAND structures result in degradation at the oxide-oxide interface during selective removal of nitride and punchthrough of tungsten wordlines when etching vias of different depths. Current techniques involve extensive etching techniques performed using a variety of chemistries and patterning processes to mask regions of the substrate to etch vias of different depths using different chemistries and process conditions. Such processes reduce throughput and reduce efficiency of fabrication processes.

Provided herein are methods and apparatuses for forming 3D NAND structures without degrading oxide-oxide interfaces and without punchthrough of a tungsten wordline by depositing an encapsulation layer over the staircase pattern to act as both a material for increasing etch selectivity during nitride etch and an etch stop layer for forming vias to pads on the tungsten wordlines. Encapsulation layers are conformal, carbon-containing layers deposited using ALD and/or CVD techniques.

Figure 10:
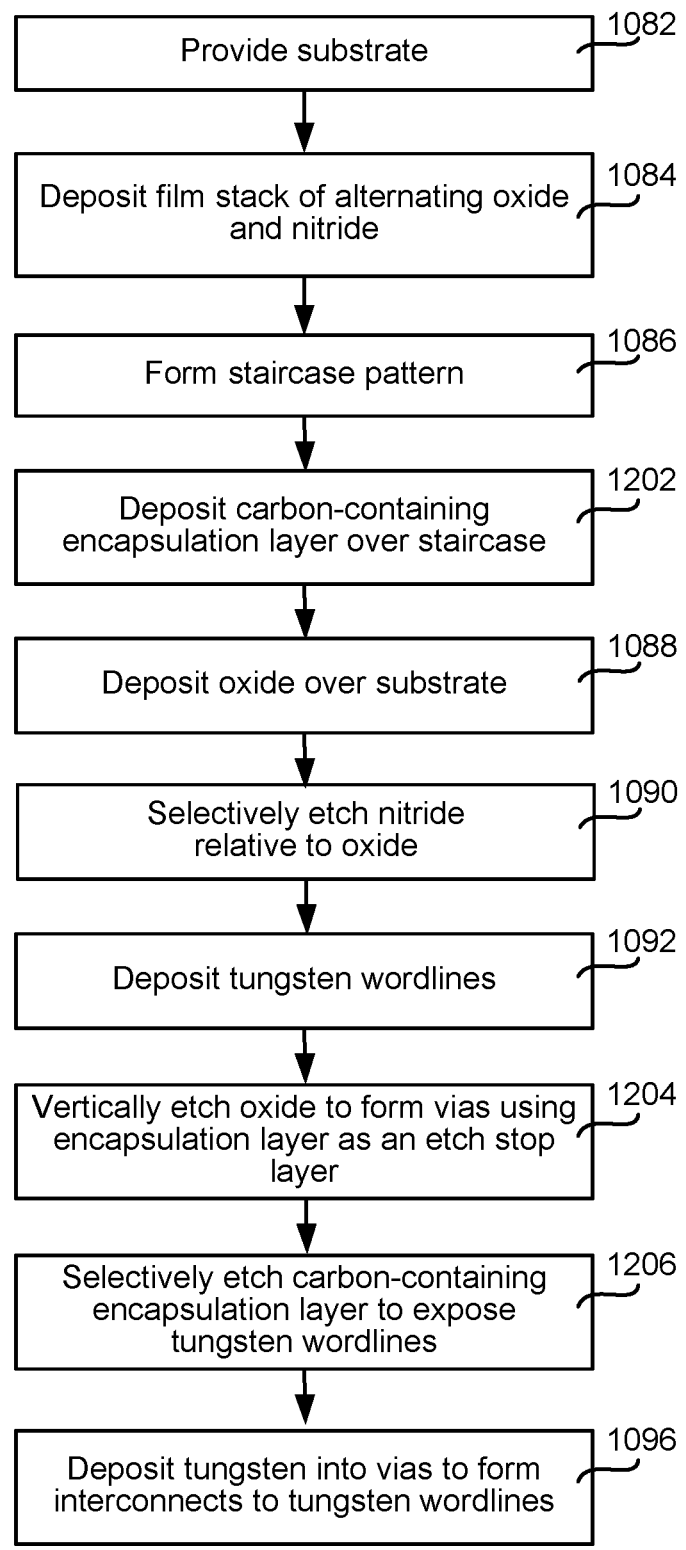
FIG. 10 is a process flow diagram depicting operations for a method performed in accordance with certain disclosed embodiments.

FIG. 10 is a process flow diagram of operations for a method performed in accordance with certain disclosed embodiments. Operations 1082 and 1084 may be the same as or similar to operations 182 and 184 of FIG. 1 above, respectively. In operation 1086, a staircase pattern is formed on the substrate. Operation 1086 may be the same as or similar to operation 186 of FIG. 1 as described above. Following deposition of the ONON stack, channels may be etched in the substrate.

In operation 1202, prior to depositing oxide over the substrate in operation 1088, a carbon-containing encapsulation layer is deposited over the staircase. The carbon-containing encapsulation layer may be any of silicon carbide (SiC), oxygen-doped silicon carbide (SiCO), nitrogen-doped silicon carbide (SiCN), boron-and-nitrogen-doped silicon carbide (SiBCN), and combinations thereof. Precursors and reactants for forming carbon-containing encapsulation layers depend on the chemistry or material of the carbon-containing encapsulation layer being deposited.

A doped silicon carbide may have a wide range of dopant concentrations. For many, doped silicon carbides have at most about 50% atomic of dopant atoms, whether those atoms are oxygen, nitrogen, or atoms of another element. The doping level provides desired film properties. In one example, the process can make SiOC films with about 10-15% atomic carbon and about 40% atomic oxygen. In another example, the film contains about 30-35% atomic carbon and about 25-30% atomic oxygen. Of course, the silicon carbide film's electrical properties will differ. Typically, for good electrical properties, the carbon content is relatively low.

The carbon-containing encapsulation layer may be deposited at a suitable deposition temperature between about 100° C. and about 700° C., or between about 150° C. and about 400° C., such as at about 400° C. In various embodiments, the chamber pressure of the chamber housing the substrate during deposition of the carbon-containing encapsulation layer may be selected depending on the deposition chemistry used and the substrate upon which the encapsulation layer is deposited. For example, in some embodiments, the chamber pressure may be between about 1 Torr and about 10 Torr, or between about 1.5 Torr and about 7 Torr.

The carbon-containing encapsulation layer is a conformal film deposited using ALD or CVD. In various embodiments, the carbon-containing encapsulation layer may be deposited using a remote plasma CVD process. In some embodiments, the deposited films are conformal. Conformality of films may be measured by the step coverage. "Step coverage" as used herein is calculated by dividing the average thickness of the deposited film on the sidewall by the average thickness of the deposited film at the top of the feature and multiplying it by 100 to obtain a percentage. Disclosed embodiments may deposit films having a step coverage of at least about 50%, or at least about 95%, or about 100%, or 100%. While conformal films may be used in various embodiments, the carbon-containing encapsulation layer may not necessarily be conformal in some embodiments. Interestingly, film having poor step coverage may still be deposited in various embodiments while still having effective encapsulation layer properties. The material in the flat portion of the feature acts as an etch stop, and hence is deposited to a sufficient thickness so as to substantially or fully cover the horizontal flat portion of the feature. In contrast, the material on the side-wall is not necessarily a dry etch stop. The material on the sidewall acts as a wet etch stop (during SiN removal) and as long as has sufficient etch selectivity during SiN removal, its thickness on the sidewall might not be critical. However, it is still desired for the film quality on the sidewall to be equally as good as the top and bottom. While PECVD may not result in high quality films for both the sidewall and the bottoms, deposition using remote plasma CVD may be more suitable.

The thickness of the encapsulation layer depends on the thickness of the ONON stack. In various embodiments, the encapsulation layer is deposited to a thickness between about 1 nm and about 350 nm.

The encapsulation layer includes carbon to allow for a high wet etch selectivity such that the encapsulation layer is etched at a substantially slower rate than nitride during wet etch of the nitride. For example, for an oxygen-doped silicon carbide layer having a dielectric constant of 4.5, the wet etch rate in $H_3PO_4$ and in 100:1 DHF (diluted hydrofluoric acid) is nearly 0, whereas the wet etch rate for $Si_3N_4$ in $H_3PO_4$ is over 60 Å/minute and in 100:1 DHF is about 5.0 Å/min.

The material selected for the carbon-containing encapsulation layer depends on the nitride and oxide films on the substrate to allow a dry etch selectivity of oxide to the carbon-containing encapsulation layer of between about 2:1 and about 100:1, or between about 20:1 and about 50:1. This allows the encapsulation layer to act as an etch stop layer in subsequent etching for forming vias in the oxide.

One example of a process for depositing a carbon-containing encapsulation layer as described herein may include the following operations. Precursor molecules for depositing silicon carbides can include silicon-containing molecules having silicon-hydrogen (Si—H) and/or silicon-silicon (Si—Si) bonds, and silicon-carbon (Si—C) bonds. Two different organo-silicon precursors can be flowed simultaneously having a given ratio of flow rates, and then changed gradually or instantaneously so that the precursors have another ratio of flow rates. By way of example, a mixture of an organo-silicon oxide precursor and an organo-silicon nitride precursor can be flowed simultaneously such that a ratio of flow rates between the two precursors is between about 1:1 and about 2:1. If the ratio of the flow rates between the organo-silicon oxide precursor and the organo-silicon nitride precursor is changed to be greater than about 2:1, then the resulting SiOCN film can have an increased concentration of oxygen relative to nitrogen as the thickness increases. In some embodiments, precursor molecules for depositing a silicon carbide carbon-containing encapsulation layer may be a silicon-containing and carbon-containing precursor. Precursor molecules for depositing silicon oxycarbides include silicon-containing molecules having silicon-hydrogen (Si—H) bonds and/or silicon-silicon (Si—Si) bonds, and silicon-oxygen (Si—O) bonds and/or silicon-carbon (Si—C) bonds. Precursor molecules for depositing silicon nitricarbides include silicon-containing molecules having silicon-hydrogen (Si—H) bonds and/or silicon-silicon (Si—Si) bonds, and silicon-nitrogen (Si—N) bonds and/or silicon-carbon (Si—C) bonds. Precursor molecules for depositing silicon oxynitricarbides include silicon-containing molecules having silicon-hydrogen (Si—H) bonds and/or silicon-silicon (Si—Si) bonds, and silicon-nitrogen (Si—N) bonds, silicon-oxygen (Si—O) bonds, and/or silicon-carbon (Si—C) bonds. In some embodiments, the silicon-containing precursors can include a reactant with Si—O bonds and a reactant with Si—C bonds. It will be understood that any number of suitable reactants may be employed in the scope of this present disclosure. The silicon-containing precursors include one or more Si—H bonds and/or one or more Si—Si bonds. During the deposition process, the Si—H bonds and/or Si—Si bonds are broken and serve as reactive sites for forming bonds between the silicon-containing precursors in a deposited silicon carbide film as a carbon-containing encapsulation layer. The broken bonds can also serve as sites for cross-linking during thermal processing conducted during or after deposition. Bonding at the reactive sites and cross-linking can form a primary backbone or matrix collectively in the resulting silicon carbide film as a carbon-containing encapsulation layer. Although silicon carbide films are described herein as example carbon-containing encapsulation layers, it will be understood that other carbon-containing encapsulation layers may be deposited. For example, the carbon-containing encapsulation layer may include any of silicon carbide, oxygen-doped silicon carbide, nitrogen-doped silicon carbide, boron-and-nitrogen-doped silicon carbide, and combinations thereof. Further, it will be understood that in some embodiments, the carbon-containing encapsulation layer may include one or more layers of carbon-containing material having any one or more of the above identified materials, and may be referred to in some cases as a carbon-containing encapsulation film.

As discussed, the precursors employed in forming silicon carbide films can include silicon-containing precursors, with at least some of the silicon-containing precursors having at least one Si—H and/or at least one Si—Si bond. In certain embodiments, the silicon-containing precursor has at most one hydrogen atom on every silicon atom. Thus, for example, a precursor having one silicon atom has at most one hydrogen atom bonded to the silicon atom; a precursor having two silicon atoms has one hydrogen atom bonded to one silicon atom and optionally another hydrogen atom bonded to the second silicon atom; a precursor having three silicon atoms has at least one hydrogen atom bonded to one silicon atom and optionally one or two more hydrogen atoms bonded to one or two of the remaining silicon atoms, and so on. In addition, the silicon-containing precursors may include at least one Si—O bond, at least one Si—N bond, and/or at least one Si—C bond. While any number of appropriate precursors can be used in forming silicon carbide films, at least some of the precursors will include silicon-containing precursors with at least one Si—H bond or Si—Si bond, and optionally at least one Si—O bond, Si—N bond, and/or Si—C bond. In various implementations, the silicon-containing precursor(s) contain no O—C or N—C bonds; e.g., the precursor(s) contain no alkoxy (—O—R), where R is an organic group such as a hydrocarbon group, or amine (—$NR_1R_2$) groups, wherein $R_1$ and $R_2$ are independently hydrogen or organic groups.

In certain embodiments, at least some of the carbon provided for the silicon carbide film is provided by one or more hydrocarbon moieties on the silicon-containing precursor. Such moieties may be from alkyl groups, alkene groups, alkyne groups, aryl groups, and the like. In certain embodiments, the hydrocarbon group has a single carbon atom to minimize steric hindrance of the Si—H and/or Si—Si bond breaking reaction during deposition. However, the precursors are not limited to single-carbon groups; higher numbers of carbon atoms may be used such as 2, 3, 4, 5, or 6 carbon atoms. In certain embodiments, the hydrocarbon group is linear. In certain embodiments, the hydrocarbon group is cyclic.

In some embodiments, the silicon-containing precursor falls into a chemical class. It will be understood that other chemical classes of silicon-containing precursors may be employed and that the silicon-containing precursors are not limited to the chemical classes discussed below.

In some embodiments, the silicon-containing precursor can be a siloxane. In some embodiments, the siloxane may be cyclic. Cyclic siloxanes may include cyclotetrasiloxanes, such as 2,4,6,8-tetramethylcyclotetrasiloxane (TMCTS), octamethylcyclotetrasiloxane (OMCTS), and heptamethylcyclotetrasiloxane (HMCTS). Other cyclic siloxanes can also include but are not limited to cyclotrisiloxanes and cyclopentasiloxanes. Embodiments using cyclic siloxanes are ring structures that can introduce porosity into an oxygen doped silicon carbide film, with the size of the pores corresponding to the radius of the ring. For example, a cyclotetrasiloxane ring can have a radius of about 6.7 Å.

In some embodiments, the siloxane may have a three-dimensional or caged structure. Caged siloxanes have silicon atoms bridged to one another via oxygen atoms to form a polyhedron or any 3-D structure. An example of a caged siloxane precursor molecule is silsesquioxane. Caged siloxane structures are described in further detail in commonly owned U.S. Pat. No. 6,576,345 to Cleemput et al., which is incorporated by reference herein in its entirety and for all purposes. Like the cyclic siloxanes, the caged siloxane can introduce porosity into an oxygen doped silicon carbide film. In some embodiments, the porosity scale is mesoporous.

In some embodiments, the siloxane may be linear. Examples of suitable linear siloxanes include but are not limited to disiloxanes, such as pentamethyldisiloxane (PMDSO) and tetramethyldisiloxane (TMDSO), and trisiloxanes such as hexamethyltrisiloxane, heptamethyltrisiloxane.

In some embodiments, the silicon-containing precursor can be an alkyl silane or other hydrocarbon-substituted silane. The alkyl silanes include a central silicon atom with one or more alkyl groups bonded to it as well as one or more hydrogen atoms bonded to it. In certain embodiments, any one or more of the alkyl groups contain 1-5 carbon atoms. The hydrocarbon groups may be saturated or unsaturated (e.g., alkene (e.g., vinyl), alkyne, and aromatic groups). Examples include but are not limited to trimethylsilane (3MS), triethylsilane, pentamethyl disilamethane (($CH_3$)$_2$Si—$CH_2$—Si($CH_3$)$_3$), and dimethylsilane (2MS).

In some embodiments, the silicon-containing precursor can be an alkoxy silane. The alkoxy silanes include a central silicon atom with one or more alkoxy groups bonded it and one or more hydrogen atoms bonded to it. Examples include but are not limited to trimethoxysilane (TMOS), dimethoxysilane (DMOS), methoxysilane (MOS), methyldimethoxysilane (MDMOS), diethyoxymethylsilane (DEMS), dimethylethoxysilane (DMES), and dimethylmethoxysilane (DMMOS).

Additionally, disilanes, trisilanes, or other higher silanes may be used in place of monosilanes. An example of one such disilane from the alkyl silane class is hexamethyldisilane (HMDS). Another example of a disilane from the alkyl silane class can include pentamethyldisilane (PMDS). Other types of alkyl silanes can include alkylcarbosilanes, which can have a branched polymeric structure with a carbon bonded to a silicon atom as well as alkyl groups bonded to a silicon atom. Examples include dimethyl trimethylsilyl methane (DTMSM) and bis-dimethylsilyl ethane (BDMSE). In some embodiments, one of the silicon atoms can have a carbon-containing or hydrocarbon-containing group attached to it, and one of the silicon atoms can have a hydrogen atom attached to it.

In depositing silicon carbide, multiple silicon-containing precursors can be present in the process gas. For example, a siloxane and an alkyl silane may be used together, or a siloxane and an alkoxy silane may be used together. The relative proportions of the individual precursors can be chosen based on the chemical structures of precursors chosen and the application of the resulting silicon carbide film.

In some embodiments, the process conditions can substantially preserve Si—C bonds and, if present, Si—O and Si—N bonds in the as-deposited layer of the silicon carbide film. Accordingly, the reaction conditions adjacent to the substrate provide for the selective breaking of Si—H and/or Si—Si bonds, e.g., extracting hydrogen from the broken Si—H bonds, but the reaction conditions do not provide for extracting oxygen from Si—O bonds, nitrogen from Si—N bonds, or carbon from Si—C bonds. However, as discussed below, introduction of a co-reactant such as oxygen may extract carbon from Si—C bonds. Generally, the described reaction conditions exist at the exposed face of the substrate (the face where the silicon carbide film is deposited). They may further exist at some distance above the substrate, e.g., about 0.5 micrometers to about 150 millimeters above the substrate. In effect, activation of the precursor can happen in the gas phase at a substantial distance above the substrate. Typically, the pertinent reaction conditions will be uniform or substantially uniform over the entire exposed face of the substrate, although certain applications may permit some variation.

In addition to silicon-containing precursors, the environment adjacent the work piece (e.g., substrate 100) can include one or more radical species, preferably in a substantially low energy state. An example of such species includes hydrogen atom radicals. In some embodiments, all, or substantially all, or a substantial fraction of the hydrogen atom radicals can be in the ground state, e.g., at least about 90% or 95% of the hydrogen atom radicals adjacent the work piece are in the ground state. In certain embodiments, source gas is provided in a carrier gas such as helium. Hydrogen gas may be a source gas in various embodiments. As an example, hydrogen gas may be provided in a helium carrier at a concentration of about 1-10% hydrogen. Pressure, fraction of carrier gas such as helium, and other process conditions are chosen so that the hydrogen atoms encounter the substrate 100 as radicals in a low energy state without recombining.

Hydrogen gas may be supplied into a remote plasma source to generate hydrogen atom radicals or hydrogen radicals. Once generated, the hydrogen atom radicals may be in an excited energy state. For example, hydrogen in an excited energy state can have an energy of at least 10.2 eV (first excited state). Excited hydrogen atom radicals may cause unselective decomposition of a silicon-containing precursor. For example, hydrogen atom radicals in an excited state can easily break Si—H, Si—Si, Si—N, Si—O, and Si—C bonds, which can alter the composition or physical or electrical characteristics of the silicon carbide film. In some implementations, when the excited hydrogen atom radicals lose their energy, or relax, the excited hydrogen atom radical may become a substantially low energy state hydrogen atom radical or a ground state hydrogen atom radical. Hydrogen atom radicals in a substantially low energy state or ground state can be capable of selectively breaking Si—H and Si—Si bonds while generally preserving Si—O, Si—N, and Si—C bonds. In some implementations, process conditions may be provided so that excited hydrogen atom radicals lose energy or relax to form substantially low energy state or ground state hydrogen atom radicals. For example, the remote plasma source or associated components may be designed so that a residence time of hydrogen atom radicals diffusing from the remote plasma source to the substrate is greater than the energetic relaxation time of an excited hydrogen atom radical. The energetic relaxation time for an excited hydrogen atom radical can be about equal to or less than about $1 \times 10^{-3}$ seconds.

A state in which a substantial fraction of hydrogen atom radicals are in the ground state can be achieved by various techniques. Some apparatus, such as described below, are designed to achieve this state. Apparatus features and process control features can be tested and tuned to produce a mild state in which a substantial fraction of the hydrogen atom radicals are in the ground state. For example, an apparatus may be operated and tested for charged particles downstream of the plasma source; i.e., near the substrate. The process and apparatus may be tuned until substantially no charged species exist near the substrate. Additionally, apparatus and process features may be tuned to a configuration where they begin to produce a silicon carbide film from a standard precursor such as trimethylsilane. The relatively mild conditions that support such film deposition are chosen.

The process conditions described earlier herein can provide a film structure that is highly conformal. The relatively mild process conditions can minimize the degree of ion bombardment at the surface of the substrate so that the deposition lacks directionality. Moreover, the relatively mild process conditions can reduce the number of radicals with high sticking coefficients that would have a tendency to stick to the sidewalls of previously deposited layers or films. In certain embodiments, for an aspect ratio of about 2:1 to 10:1, the silicon carbide film may be deposited with a conformality of between about 25% and 100%, more typically between about 50% and 100%, and even more typically between about 80% and 100%.

In some embodiments, the process conditions employ radical species in a substantially low energy state sufficient to break Si—H bonds and/or Si—Si bonds while substantially preserving Si—O, Si—N, and Si—C bonds. Such process conditions may not have substantial amounts of ions, electrons, or radical species in high energy states such as states above the ground state. In some embodiments, the concentration of ions in the region adjacent the film is no greater than about $10^7/cm^3$. The presence of substantial amounts of ions or high energy radicals may tend to break Si—O, Si—N, and Si—C bonds, which can produce films with undesirable electrical properties (e.g., high dielectric constants and/or low breakdown voltages) and poor conformality.

The silicon-containing precursors are typically delivered with other species, notably carrier gas, in the environment adjacent to the substrate. In some implementations, the silicon-containing precursors are present with the radical species and other species, including other reactive species and/or carrier gases. In some embodiments, the silicon-containing precursors may be introduced as a mixture. Upstream from the deposition reaction surface, the silicon-containing precursors can be mixed with an inert carrier gas. Example inert carrier gases include, but are not limited to, nitrogen ($N_2$), argon (Ar), and helium (He). In addition, the silicon-containing precursors can be introduced in a mixture having major and minor species, with the minor species containing some element or structural feature (e.g., a ring structure, a cage structure, an unsaturated bond, etc.) that is present in the silicon carbide film at a relatively low concentration. The multiple precursors may be present in equimolar or relatively similar proportions as appropriate to form the primary backbone or matrix in the resulting silicon carbide film. In other embodiments, the relative amounts of the different precursors are substantially skewed from equimolarity.

In some embodiments, one or more silicon-containing precursors provide essentially all of the mass of the deposited silicon carbide film, with small amounts of hydrogen or other element from a remote plasma providing less than about 5% atomic or less than about 2% atomic of the film mass. In some embodiments, only the radical species and one or more silicon-containing precursors contribute to the composition of the deposited silicon carbide film. In other embodiments, the deposition reaction includes a co-reactant other than one or more silicon-containing precursors and the radical species. Examples of such co-reactants include carbon dioxide ($CO_2$), carbon monoxide (CO), water ($H_2O$), methanol ($CH_3OH$), oxygen ($O_2$), ozone ($O_3$), nitrogen ($N_2$), nitrous oxide ($N_2O$), ammonia ($NH_3$), diazene ($N_2H_2$), methane ($CH_4$), ethane ($C_2H_6$), acetylene ($C_2H_2$), ethylene ($C_2H_4$), diborane ($B_2H_6$), and combinations thereof. Such materials may be used as nitriding agents, oxidizers, reductants, etc. In some cases, they can be used to tune the amount of carbon in the deposited film by removing a fraction of the carbon provided with the silicon-containing precursor. In some implementations employing a non-hydrogen co-reactant, the co-reactant is introduced to the reaction chamber via the same flow path as the silicon-containing precursor; e.g., a path including a showerhead, typically without direct exposure to plasma. In some embodiments, oxygen and/or carbon dioxide is introduced with the precursor to alter the composition of the silicon carbide film by removing carbon from the film or precursor during deposition. In some implementations employing a non-hydrogen co-reactant, the co-reactant is introduced to the reaction chamber via the same flow path as the hydrogen, such that the co-reactant is at least partially converted to radicals and/or ions. In such implementations, the hydrogen radicals and the co-reactant radicals both react with the silicon-containing precursor(s) to produce the deposited silicon carbide film.

In certain embodiments where co-reactants are used and they are introduced to the chamber with the species being converted to radicals (e.g., hydrogen), they may be provided to the reaction chamber in relatively small amounts in comparison to the other gases in the reaction chamber, including the source of radicals (e.g., hydrogen) and any carrier gas(es) such as helium. For example, the co-reactant may be present in the process gases at about 0.05% or less by mass, or at about 0.01% or less by mass, or at about 0.001% or less by mass. For example, a reactant mixture (that goes into the plasma source) may be about 10-20 liters per minute (L/m) He, about 200-500 standard cubic centimeters per minute (sccm) H2, and about 1-10 sccm oxygen. When the co-reactants are introduced to the reaction chamber along with the silicon-containing precursor (e.g., through a showerhead), they may be present at a higher concentration; for example about 2% or less or about 0.1% or less. When the co-reactant is a relatively weak reactant (e.g., a weak oxidant such as carbon dioxide), it may be present at even higher concentrations, such as about 10% or less or about 4% or less.

The carbon-containing encapsulation layer may be deposited by a variety of techniques. Additional examples of techniques are described in U.S. Patent Application Publication No. 2013/0330935, filed on Jun. 12, 2012, entitled "REMOTE PLASMA BASE DEPOSITION OF SiOC CLASS OF FILMS;" U.S. Patent Application Publication No. 2015/0303056, filed on Feb. 6, 2015, entitled "CONFORMAL DEPOSITION OF SILICON CARBIDE FILMS;" U.S. Pat. No. 9,371,579 issued Jun. 21, 2016 and filed on Oct. 24, 2013, entitled "GROUND STATE HYDROGEN RADICAL SOURCES FOR CHEMICAL VAPOR DEPOSITION OF SILICON-CARBON-CONTAINING FILMS;" and U.S. Patent Application Publication No. 2014/0356549, filed on May 31, 2013, and entitled "METHOD TO OBTAIN SIC CLASS OF FILMS OF DESIRED COMPOSITION AND FILM PROPERTIES," all of which are herein incorporated by reference in their entireties.

One example of a process for depositing the carbon-containing encapsulation layer as described herein may include the following operations. The carbon-containing encapsulation layer may be deposited by ALD. ALD is a technique that deposits thin layers of material using sequential self-limiting reactions. Typically, an ALD cycle includes operations to deliver and adsorb at least one reactant to the substrate surface, and then react the adsorbed reactant with one or more reactants to form the partial layer of film. As an example, a silicon carbide deposition cycle may include the following operations: (i) delivery/adsorption of a silicon precursor, (ii) purging of the silicon precursor from the chamber, (iii) delivery of a carbon-containing reactant with an optional plasma, and (iv) purging of the carbon-containing gas and/or plasma from the chamber.

Unlike a chemical vapor deposition (CVD) technique, ALD processes use surface-mediated deposition reactions to deposit films on a layer-by-layer basis. In one example of an ALD process, a substrate surface that includes a population of surface active sites is exposed to a gas phase distribution of a first precursor, such as a silicon precursor, in a dose provided to a chamber housing a substrate. Molecules of this first precursor are adsorbed onto the substrate surface, including chemisorbed species and/or physisorbed molecules of the first precursor. It should be understood that when the compound is adsorbed onto the substrate surface as described herein, the adsorbed layer may include the compound as well as derivatives of the compound. For example, an adsorbed layer of a silicon precursor may include the silicon precursor as well as derivatives of the silicon precursor. After a first precursor dose, the chamber is then evacuated to remove most or all of first precursor remaining in gas phase so that mostly or only the adsorbed species remain. In some implementations, the chamber may not be fully evacuated. For example, the chamber may be evacuated such that the partial pressure of the first precursor in gas phase is sufficiently low to mitigate a reaction. A second reactant, such as a carbon-containing reactant, is introduced to the chamber so that some of these molecules react with the first precursor adsorbed on the surface. In some processes, the second reactant reacts immediately with the adsorbed first precursor. In other embodiments, the second reactant reacts only after a source of activation is applied temporally. In some embodiments, a plasma is ignited during the second reactant dose. The chamber may then be evacuated again to remove unbound second reactant molecules. As described above, in some embodiments the chamber may not be completely evacuated. Additional ALD cycles may be used to build film thickness.

In certain embodiments, an ALD first precursor dose partially saturates the substrate surface. In some embodiments, the dose phase of an ALD cycle concludes before the precursor contacts the substrate to evenly saturate the surface. Typically, the precursor flow is turned off or diverted at this point, and only purge gas flows. By operating in this sub-saturation regime, the ALD process reduces the cycle time and increases throughput. However, because precursor adsorption is not saturation limited, the adsorbed precursor concentration may vary slightly across the substrate surface. Examples of ALD processes operating in the sub-saturation regime are provided in U.S. patent application Ser. No. 14/061,587 (now U.S. Pat. No. 9,355,839), filed Oct. 23, 2013, titled "SUB-SATURATED ATOMIC LAYER DEPOSITION AND CONFORMAL FILM DEPOSITION," which is incorporated herein by reference in its entirety.

As described, in some implementations, the ALD methods include plasma activation. As described herein, the ALD methods and apparatuses described herein may be conformal film deposition (CFD) methods, which are described generally in U.S. patent application Ser. No. 13/084,399 (now U.S. Pat. No. 8,728,956), filed Apr. 11, 2011, and titled "PLASMA ACTIVATED CONFORMAL FILM DEPOSITION," and in U.S. patent application Ser. No. 13/084,305, filed Apr. 11, 2011, and titled "SILICON NITRIDE FILMS AND METHODS," which are herein incorporated by reference in their entireties.

In some embodiments, plasma may be used during deposition, such as during exposure the carbon-containing reactant. Plasma energy may be provided to activate the second reactant, such as a carbon-containing gas, into ions and radicals and other activated species, which react with the adsorbed layer of the first precursor. In various embodiments, the plasma is an in-situ plasma, such that the plasma is formed directly above the substrate surface in the chamber. The in-situ plasma may be ignited at a power per substrate area between about 0.2122 $W/cm^2$ and about 2.122 $W/cm^2$. For example, the power may range from about 150 W to about 6000 W, or from about 600 W to about 6000 W, or from about 800 W to about 4000 W, for a chamber processing four 300 mm wafers. For example, plasmas for ALD processes may be generated by applying a radio frequency (RF) field to a gas using two capacitively coupled plates. Ionization of the gas between plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. In various embodiments, a high frequency plasma is used having a frequency of at least about 13.56 MHz, or at least about 27 MHz, or at least about 40 MHz, or at least about 60 MHz. In some embodiments, a microwave-based plasma may be used. Non-limiting examples of electrodes include process gas distribution showerheads and substrate support pedestals. It will be appreciated that plasmas for ALD processes may be formed by one or more suitable methods other than capacitive coupling of an RF field to a gas. In some embodiments, the plasma is a remote plasma, such that a second reactant is ignited in a remote plasma generator upstream of the chamber, then delivered to the chamber where the substrate is housed.

For deposition of an encapsulation layer by ALD, one or more cycles may be used to build deposition thickness.

Figure 11:
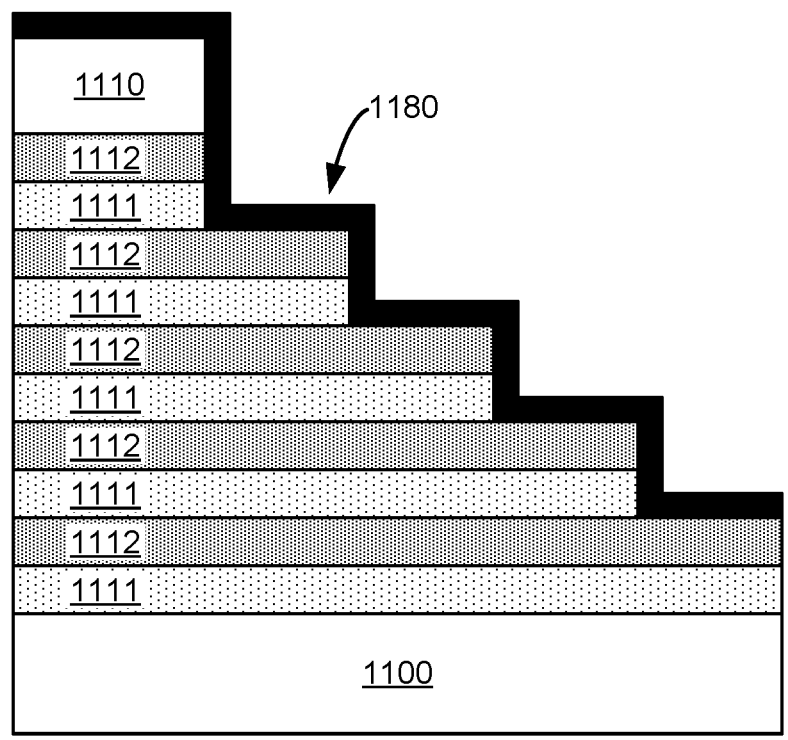
FIGS. 11-17 are schematic illustrations of a substrate in a patterning scheme performed in accordance with certain disclosed embodiments.

FIG. 11 shows an example substrate 1100 having oxide (1111) and nitride (1112) alternating layers etched in a staircase pattern with a hardmask 1110 and an encapsulation layer 1180 deposited conformally over the staircase pattern.

Figure 12:
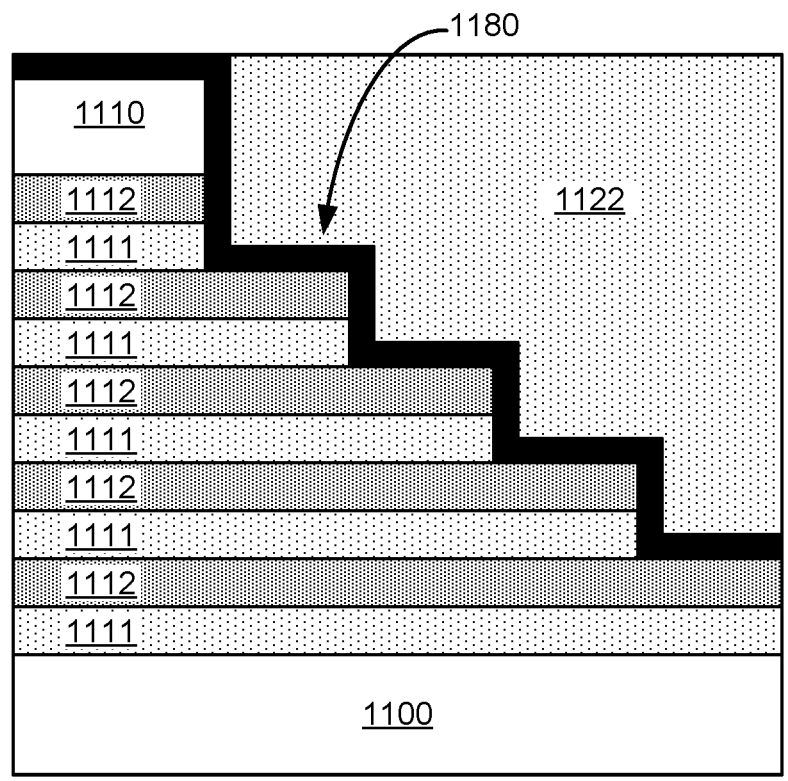

Returning to FIG. 10, in operation 1088, oxide is deposited over the substrate. As shown in FIG. 12, oxide 1122 is deposited over the substrate and thus also over the encapsulation layer 1180. The deposition techniques and process conditions may be any of those described above with respect to operation 188 of FIG. 1.

Figure 13:
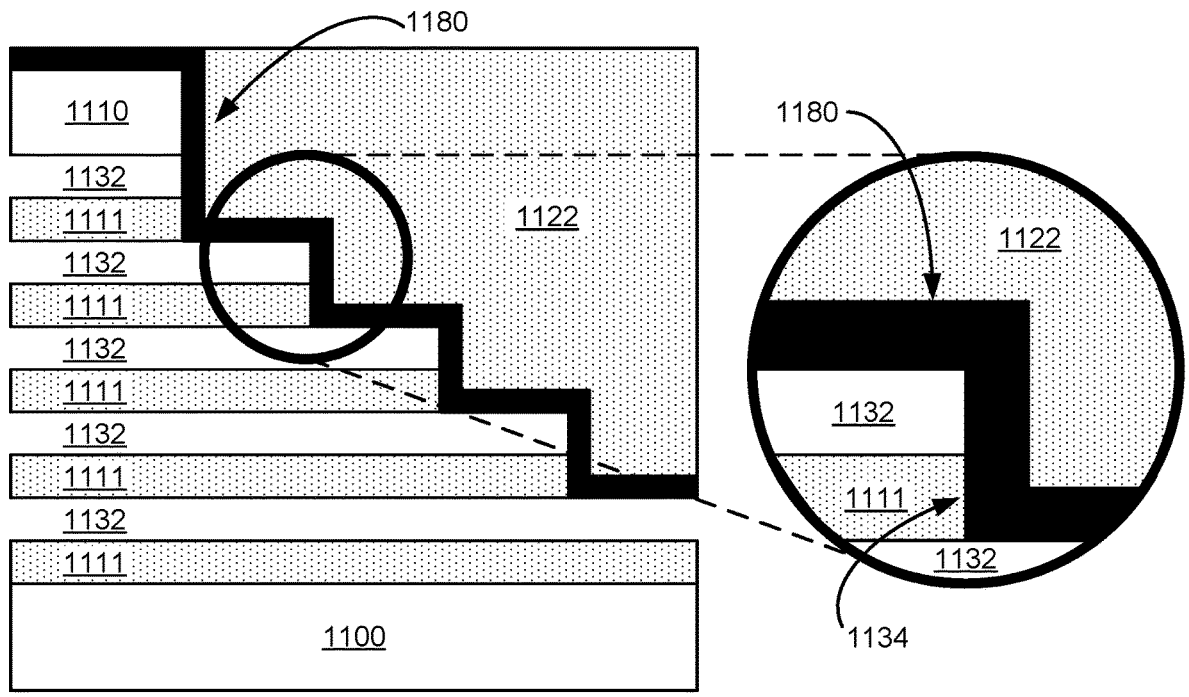

In operation 1090, nitride is selectively etched relative to oxide. The etching process and process conditions may be any of those described above with respect to operation 190 of FIG. 1. FIG. 13 shows a schematic illustration of an example substrate 1100 with nitride removed to form gaps 1132 between layers of oxide 1111. Note in the zoomed in view 1170 of the oxide-oxide interface, the encapsulation layer 1180 prevents the oxide-oxide interface from degrading, thereby preserving the oxide layer 1111 and the oxide 1122 and leaving gaps 1132 between oxide layers. As compared to FIG. 6A where a gap is formed between the oxide layer 111 and oxide 1122, FIG. 13 shows that no gap is formed between oxide layer 1111 and oxide 1122 due to the encapsulation layer 1180 previously deposited over the staircase structure. The encapsulation layer has a low wet etch rate relative to nitride such that nitride is removed without removing the encapsulation layer. The wet etch rate selectivity of nitride to carbon-containing encapsulation layer may be greater than about 10, to infinity; in some embodiments, the wet etch rate selectivity may be between about 10 and about 100. A high quality silicon carbide film having a zero or near zero wet etch rate in dilute hydrofluoric acid may be used as a carbon-containing encapsulation layer in various embodiments, such that wet etch rate selectivity to nitride may be up to infinity.

Figure 14:
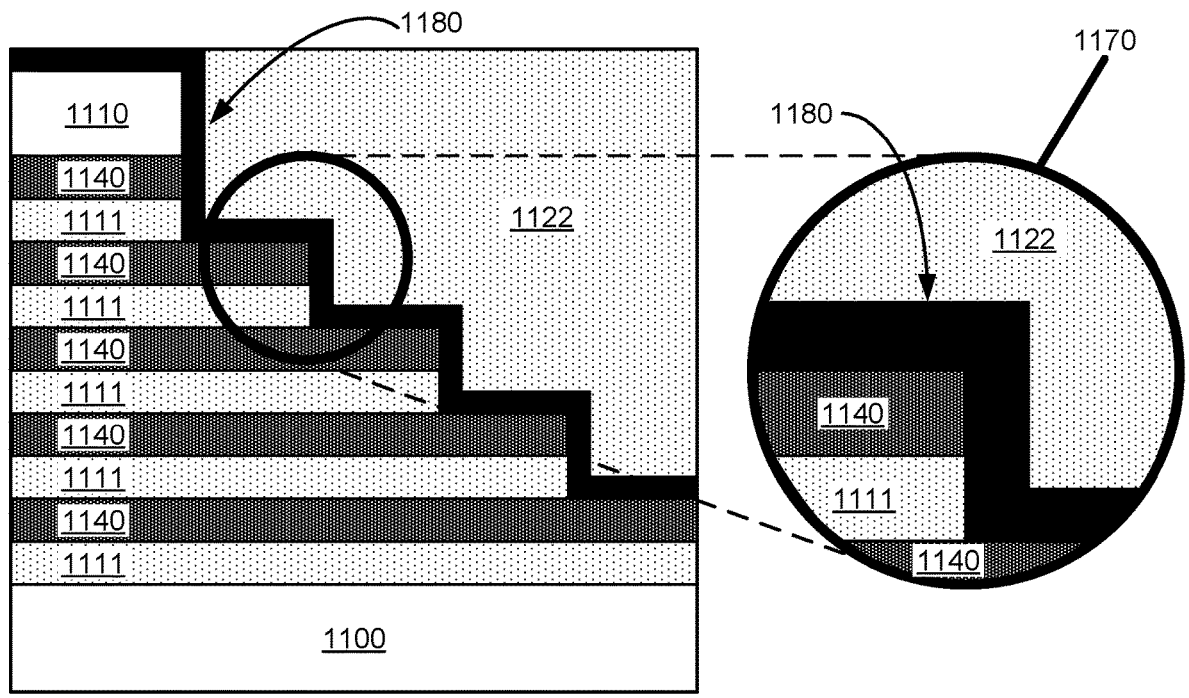

Returning to FIG. 10, in operation 1092, tungsten is deposited into the substrate to form tungsten wordlines. This operation may be performed using any technique or process condition as described above with respect to operation 192 of FIG. 1. FIG. 14 shows a schematic illustration of an example substrate 1100 whereby tungsten wordlines 1140 is deposited into the gaps between the oxide layers 1111. As shown in the zoomed in view at 1170, the tungsten wordlines 1140 is deposited into the gaps between the oxide layers 1111 without forming connections between tungsten wordlines as there is no gap formed in the oxide layer 1111 due to the presence of the encapsulation layer 1180.

Figure 15:
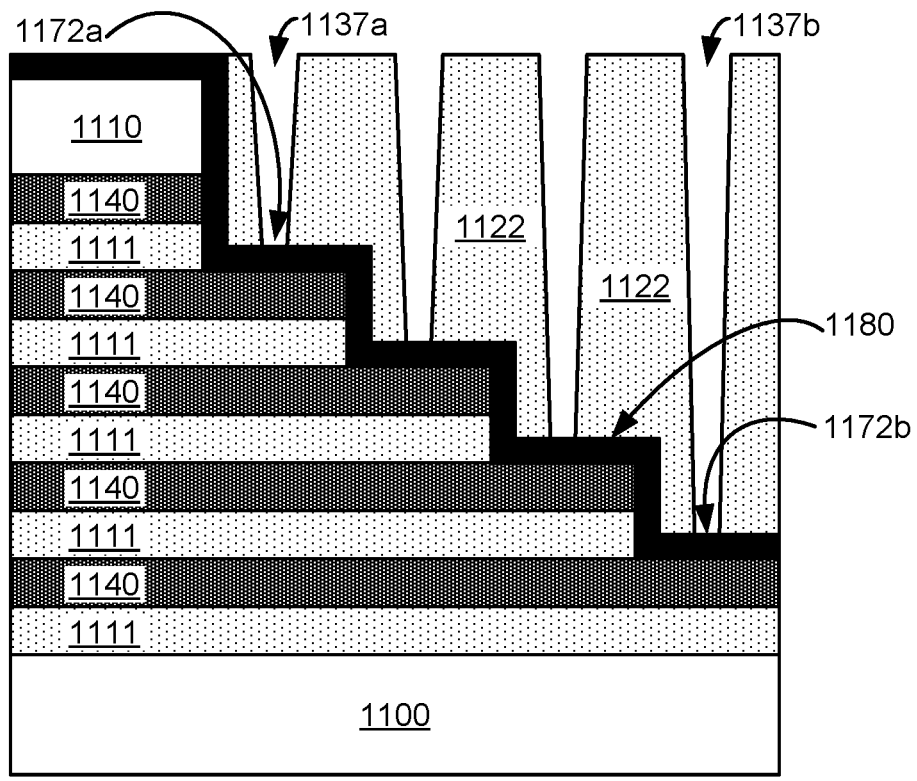

Returning to FIG. 10, in operation 1204, the oxide is etched to form vias using the encapsulation layer as an etch stop layer. This operation may be performed using any of the techniques, chemistries, and process conditions as described above with respect to operation 194 of FIG. 1. For example, a dry etch process that has etch selectivity to etch oxide at a fast rate than etching the carbon-containing encapsulation layer may be used. The etch selectivity of oxide to carbon-containing encapsulation layer may be between about 4 and about 8. Since the carbon-containing encapsulation layer etches at a much slower rate than oxide, the carbon-containing encapsulation layer prevents punchthrough of the tungsten wordline at the pads while the deeper vias are etched. FIG. 15 shows an example schematic illustration of a substrate 1100 whereby the pad at 1172a can withstand exposure to the dry etch species in via 1137a after via 1137a is formed in oxide 1122 due to the encapsulation layer 1180 acting as an etch stop layer while the deeper via 1137b is etched. The substrate 1100 can be exposed to the etching species for the duration sufficient to form via 1137b until the encapsulation layer 1180 is exposed at 1172b.

Figure 16:
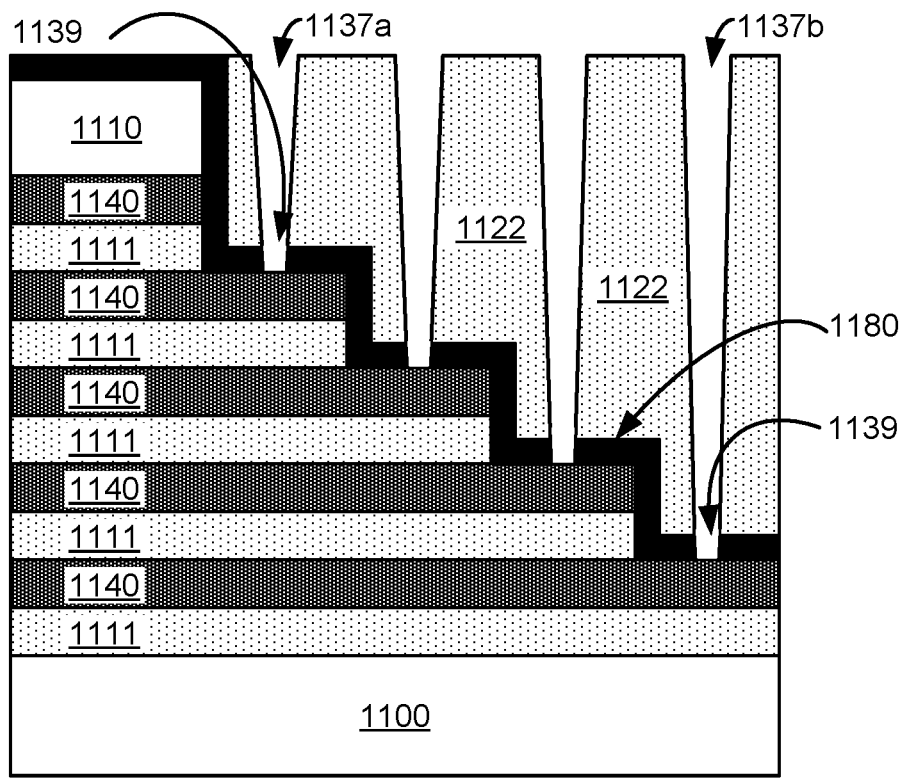

Returning to FIG. 10, in operation 1206, the carbon-containing encapsulation layer is selectively etched to expose the tungsten wordlines. FIG. 16 shows an example schematic illustration of a substrate 1100 whereby the encapsulation layer 1181 is etched at 1139 to expose the tungsten wordline 1140. The encapsulation layer may be etched using any suitable etch chemistry, such as a dry etch chemistry.

Figure 17:
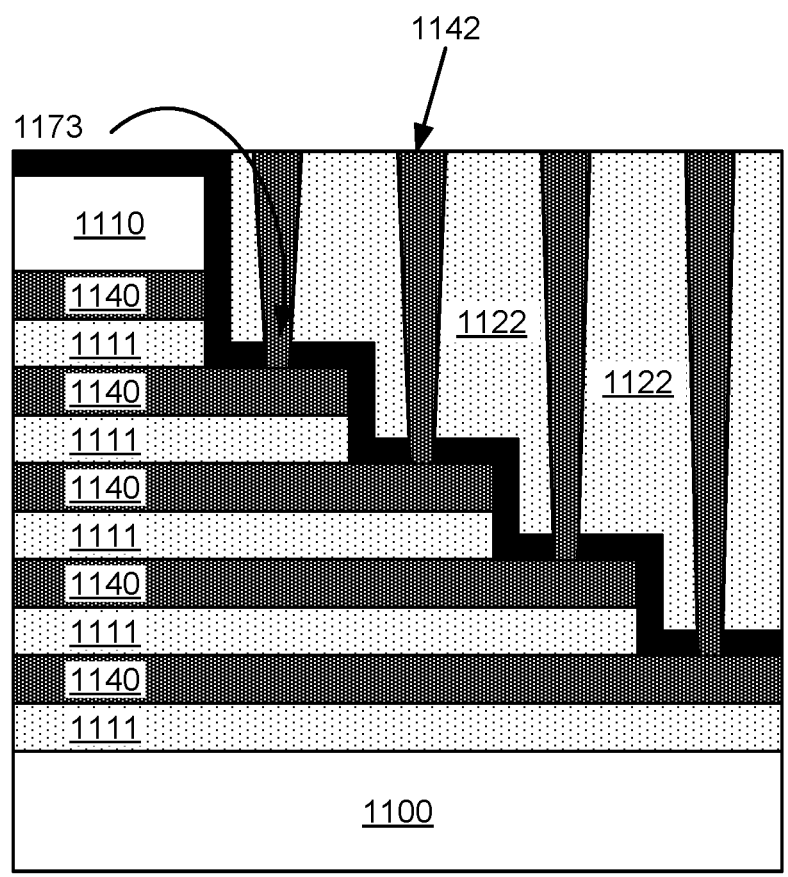

Returning to FIG. 10, in operation 1096, tungsten is deposited into the vias to form interconnects to the tungsten wordlines. Techniques and process conditions may be any of those described above with respect to operation 196 of FIG. 1. An example is shown in FIG. 17 whereby tungsten 1142 is deposited into the vias to form an interconnect to the tungsten wordlines 1140 at, for example, 1173. Unlike FIG. 9, because the encapsulation layer acted as an etch stop layer during formation of the vias, no short circuit is formed.

Apparatus

Figure 18:
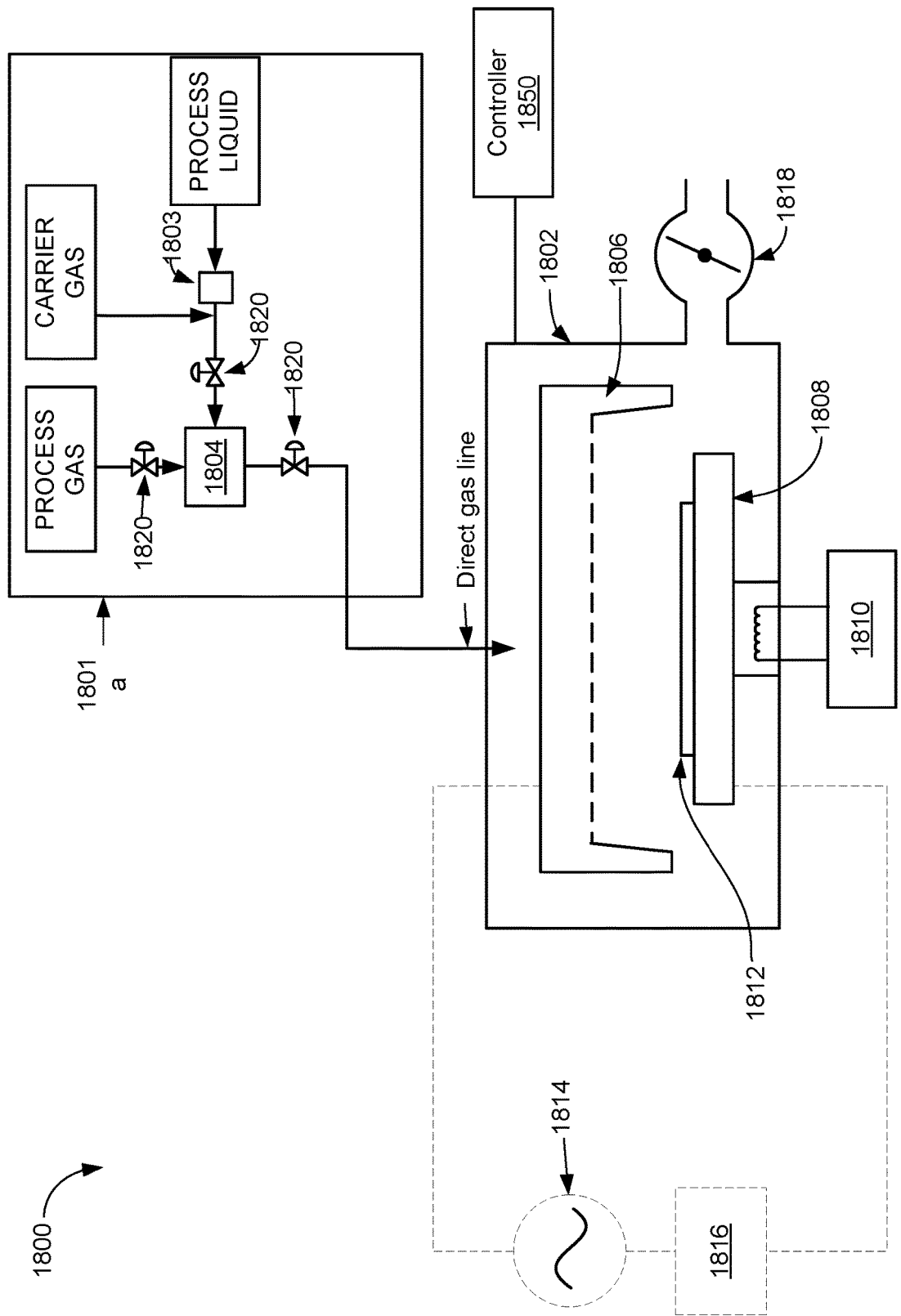
FIGS. 18, 20, and 22 are schematic diagrams of example process chambers for performing certain disclosed embodiments.
Figure 19:
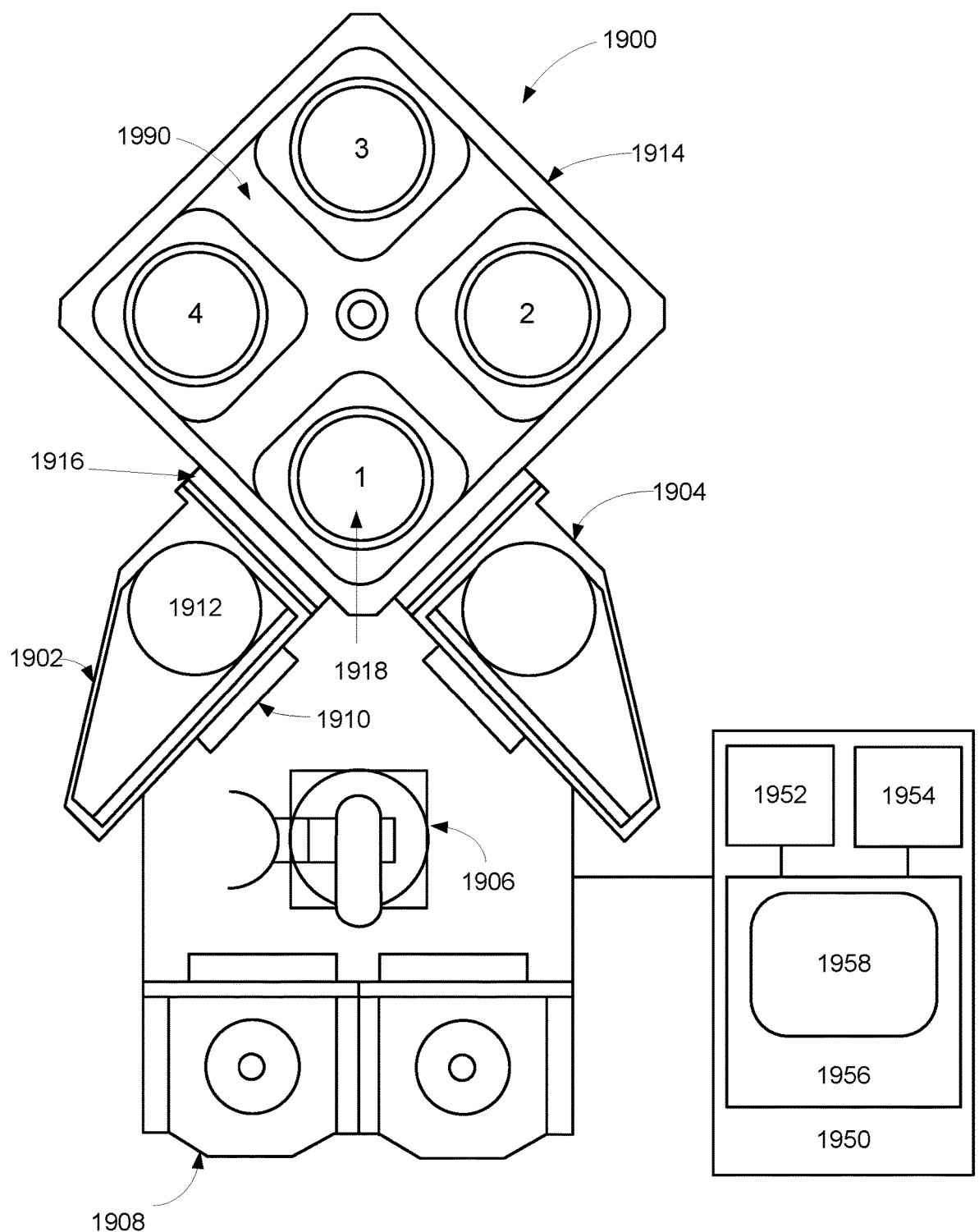
FIGS. 19 and 21 are schematic diagram of example process tools for performing certain disclosed embodiments.

FIG. 18 depicts a schematic illustration of an embodiment of an atomic layer deposition (ALD) and/or chemical vapor deposition (CVD) process station 1800 having a process chamber body 1802 for maintaining a low-pressure environment. A plurality of process stations 1800 may be included in a common low pressure process tool environment. For example, FIG. 19 depicts an embodiment of a multi-station processing tool 1900. In some embodiments, one or more hardware parameters of ALD process station 1800 including those discussed in detail below may be adjusted programmatically by one or more computer controllers 1850.

Process station 1800 fluidly communicates with reactant delivery system 1801a for delivering process gases to a distribution showerhead 1806. Reactant delivery system 1801a includes a mixing vessel 1804 for blending and/or conditioning process gases, such as a silicon precursor gas, or second reactant gas (e.g., a carbon-containing reactant), for delivery to showerhead 1806. One or more mixing vessel inlet valves 1820 may control introduction of process gases to mixing vessel 1804. Plasma may also be delivered to the showerhead 1806 or may be generated in the process station 1800. Reactant delivery system 1801a may be configured to deliver process gases for depositing a carbon-containing encapsulation over a substrate provided in the process station 1800.

As an example, the embodiment of FIG. 18 includes a vaporization point 1803 for vaporizing liquid reactant to be supplied to the mixing vessel 1804. In some embodiments, vaporization point 1803 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve purging and/or evacuating the delivery piping to remove residual reactant. However, purging the delivery piping may increase process station cycle time, degrading process station throughput. Thus, in some embodiments, delivery piping downstream of vaporization point 1803 may be heat traced. In some examples, mixing vessel 1804 may also be heat traced. In one non-limiting example, piping downstream of vaporization point 1803 has an increasing temperature profile extending from approximately 100° C. to approximately 150° C. at mixing vessel 1804.

In some embodiments, liquid precursor or liquid reactant may be vaporized at a liquid injector. For example, a liquid injector may inject pulses of a liquid reactant into a carrier gas stream upstream of the mixing vessel. In one embodiment, a liquid injector may vaporize the reactant by flashing the liquid from a higher pressure to a lower pressure. In another example, a liquid injector may atomize the liquid into dispersed microdroplets that are subsequently vaporized in a heated delivery pipe. Smaller droplets may vaporize faster than larger droplets, reducing a delay between liquid injection and complete vaporization. Faster vaporization may reduce a length of piping downstream from vaporization point 1803. In one scenario, a liquid injector may be mounted directly to mixing vessel 1804. In another scenario, a liquid injector may be mounted directly to showerhead 1806.

In some embodiments, a liquid flow controller (LFC) upstream of vaporization point 1803 may be provided for controlling a mass flow of liquid for vaporization and delivery to process station 1800. For example, the LFC may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, this may be performed by disabling a sense tube of the LFC and the PID controller.

Showerhead 1806 distributes process gases toward substrate 1812. In the embodiment shown in FIG. 18, the substrate 1812 is located beneath showerhead 1806 and is shown resting on a pedestal 1808. Showerhead 1806 may have any suitable shape, and may have any suitable number and arrangement of ports for distributing process gases to substrate 1812.

In some embodiments, pedestal 1808 may be raised or lowered to expose substrate 1812 to a volume between the substrate 1812 and the showerhead 1806. It will be appreciated that, in some embodiments, pedestal height may be adjusted programmatically by a suitable computer controller 1850.

In another scenario, adjusting a height of pedestal 1808 may allow a plasma density to be varied during plasma activation cycles in the process in embodiments where a plasma is ignited. At the conclusion of the process phase, pedestal 1808 may be lowered during another substrate transfer phase to allow removal of substrate 1812 from pedestal 1808.

In some embodiments, pedestal 1808 may be temperature controlled via heater 1810. In some embodiments, the pedestal 1808 may be heated to a temperature of at least about 250° C., or in some embodiments, less than about 300° C., such as about 250° C., during deposition of silicon nitride films as described in disclosed embodiments. In some embodiments, the pedestal is set at a temperature between about 50° C. and about 300° C., such as at a temperature between about 200° C. and about 275° C. In some embodiments, the pedestal is set at a temperature between about 50° C. and about 300° C. In some embodiments, the pedestal is set at a temperature between about 200° C. and about 275° C.

Further, in some embodiments, pressure control for process station 1800 may be provided by butterfly valve 1818. As shown in the embodiment of FIG. 18, butterfly valve 1818 throttles a vacuum provided by a downstream vacuum pump (not shown). However, in some embodiments, pressure control of process station 1800 may also be adjusted by varying a flow rate of one or more gases introduced to the process station 1800.

In some embodiments, a position of showerhead 1806 may be adjusted relative to pedestal 1808 to vary a volume between the substrate 1812 and the showerhead 1806. Further, it will be appreciated that a vertical position of pedestal 1808 and/or showerhead 1806 may be varied by any suitable mechanism within the scope of the present disclosure. In some embodiments, pedestal 1808 may include a rotational axis for rotating an orientation of substrate 1812. It will be appreciated that, in some embodiments, one or more of these example adjustments may be performed programmatically by one or more suitable computer controllers 1850.

In some embodiments where plasma may be used as discussed above, showerhead 1806 and pedestal 1808 electrically communicate with a radio frequency (RF) power supply 1814 and matching network 1816 for powering a plasma. In some embodiments, the plasma energy may be controlled by controlling one or more of a process station pressure, a gas concentration, an RF source power, an RF source frequency, and a plasma power pulse timing. For example, RF power supply 1814 and matching network 1816 may be operated at any suitable power to form a plasma having a desired composition of radical species. Examples of suitable powers are included above. Likewise, RF power supply 1814 may provide RF power of any suitable frequency. In some embodiments, RF power supply 1814 may be configured to control high- and low-frequency RF power sources independently of one another. Example low-frequency RF frequencies may include, but are not limited to, frequencies between 0 kHz and 500 kHz. Example high-frequency RF frequencies may include, but are not limited to, frequencies between 1.8 MHz and 2.45 GHz, or greater than about 13.56 MHz, or greater than 27 MHz, or greater than 180 MHz, or greater than 60 MHz. It will be appreciated that any suitable parameters may be modulated discretely or continuously to provide plasma energy for the surface reactions.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, instructions for a controller 1850 may be provided via input/output control (IOC) sequencing instructions. In one example, the instructions for setting conditions for a process phase may be included in a corresponding recipe phase of a process recipe. In some cases, process recipe phases may be sequentially arranged, so that all instructions for a process phase are executed concurrently with that process phase. In some embodiments, instructions for setting one or more reactor parameters may be included in a recipe phase. For example, a first recipe phase may include instructions for setting a flow rate of an inert and/or a reactant gas (e.g., the first precursor such as a silicon precursor), instructions for setting a flow rate of a carrier gas (such as argon), and time delay instructions for the first recipe phase. A second, subsequent recipe phase may include instructions for modulating or stopping a flow rate of an inert and/or a reactant gas, and instructions for modulating a flow rate of a carrier or purge gas and time delay instructions for the second recipe phase. A third recipe phase may include instructions for modulating a flow rate of a second reactant gas such as a carbon-containing reactant, instructions for modulating the flow rate of a carrier or purge gas, and time delay instructions for the third recipe phase. A fourth, subsequent recipe phase may include instructions for modulating or stopping a flow rate of an inert and/or a reactant gas, and instructions for modulating a flow rate of a carrier or purge gas and time delay instructions for the fourth recipe phase. It will be appreciated that these recipe phases may be further subdivided and/or iterated in any suitable way within the scope of the disclosed embodiments.

As described above, one or more process stations may be included in a multi-station processing tool. FIG. 19 shows a schematic view of an embodiment of a multi-station processing tool 1900 with an inbound load lock 1902 and an outbound load lock 1904, either or both of which may include a remote plasma source. A robot 1906 at atmospheric pressure is configured to move wafers from a cassette loaded through a pod 1908 into inbound load lock 1902 via an atmospheric port 1910. A wafer is placed by the robot 1906 on a pedestal 1912 in the inbound load lock 1902, the atmospheric port 1910 is closed, and the load lock is pumped down. Where the inbound load lock 1902 includes a remote plasma source, the wafer may be exposed to a remote plasma treatment in the load lock prior to being introduced into a processing chamber 1914. Further, the wafer also may be heated in the inbound load lock 1902 as well, for example, to remove moisture and adsorbed gases. Next, a chamber transport port 1916 to processing chamber 1914 is opened, and another robot (not shown) places the wafer into the reactor on a pedestal of a first station shown in the reactor for processing. While the embodiment depicted in FIG. 19 includes load locks, it will be appreciated that, in some embodiments, direct entry of a wafer into a process station may be provided.

The depicted processing chamber 1914 includes four process stations, numbered from 1 to 4 in the embodiment shown in FIG. 19. Each station has a heated pedestal (shown at 1918 for station 1), and gas line inlets. It will be appreciated that in some embodiments, each process station may have different or multiple purposes. For example, in some embodiments, a process station may be switchable between an ALD and plasma-enhanced ALD process mode. Additionally or alternatively, in some embodiments, processing chamber 1914 may include one or more matched pairs of ALD and plasma-enhanced ALD process stations. While the depicted processing chamber 1914 includes four stations, it will be understood that a processing chamber according to the present disclosure may have any suitable number of stations. For example, in some embodiments, a processing chamber may have five or more stations, while in other embodiments a processing chamber may have three or fewer stations.

FIG. 19 depicts an embodiment of a wafer handling system 1990 for transferring wafers within processing chamber 1914. In some embodiments, wafer handling system 1990 may transfer wafers between various process stations and/or between a process station and a load lock. It will be appreciated that any suitable wafer handling system may be employed. Non-limiting examples include wafer carousels and wafer handling robots. FIG. 19 also depicts an embodiment of a system controller 1950 employed to control process conditions and hardware states of process tool 1900. System controller 1950 may include one or more memory devices 1956, one or more mass storage devices 1954, and one or more processors 1952. Processor 1952 may include a CPU or computer, analog, and/or digital input/output connections, stepper motor controller boards, etc.

In some embodiments, system controller 1950 controls all of the activities of process tool 1900. System controller 1950 executes system control software 1958 stored in mass storage device 1954, loaded into memory device 1956, and executed on processor 1952. Alternatively, the control logic may be hard coded in the controller 1950. Applications Specific Integrated Circuits, Programmable Logic Devices (e.g., field-programmable gate arrays, or FPGAs) and the like may be used for these purposes. In the following discussion, wherever "software" or "code" is used, functionally comparable hard coded logic may be used in its place. System control software 1958 may include instructions for controlling the timing, mixture of gases, gas flow rates, chamber and/or station pressure, chamber and/or station temperature, wafer temperature, target power levels, RF power levels, substrate pedestal, chuck and/or susceptor position, and other parameters of a particular process performed by process tool 1900. System control software 1958 may be configured in any suitable way. For example, various process tool component subroutines or control objects may be written to control operation of the process tool components used to carry out various process tool processes. System control software 1958 may be coded in any suitable computer readable programming language.

In some embodiments, system control software 1958 may include input/output control (IOC) sequencing instructions for controlling the various parameters described above. Other computer software and/or programs stored on mass storage device 1954 and/or memory device 1956 associated with system controller 1950 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1918 and to control the spacing between the substrate and other parts of process tool 1900.

A process gas control program may include code for controlling gas composition (e.g., silicon precursor gases, and carbon-containing gases, carrier gases and purge gases as described herein) and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations in accordance with the embodiments herein.

A pressure control program may include code for maintaining the pressure in the reaction chamber in accordance with the embodiments herein.

In some embodiments, there may be a user interface associated with system controller 1950. The user interface may include a display screen, graphical software displays of the apparatus and/or process conditions, and user input devices such as pointing devices, keyboards, touch screens, microphones, etc.

In some embodiments, parameters adjusted by system controller 1950 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1950 from various process tool sensors. The signals for controlling the process may be output on the analog and digital output connections of process tool 1900. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1950 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller 1950 will typically include one or more memory devices and one or more processors configured to execute the instructions so that the apparatus will perform a method in accordance with disclosed embodiments. Machine-readable media containing instructions for controlling process operations in accordance with disclosed embodiments may be coupled to the system controller 1950.

In some implementations, the system controller 1950 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller 1950, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller 1950 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller 1950 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller 1950, in some implementations, may be a part of or coupled to a computer that is integrated with, coupled to the system, otherwise networked to the system, or a combination thereof. For example, the system controller 1950 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller 1950 receives instructions in the form of data, which specify parameters for each of the processing steps to be performed during one or more operations. It should be understood that the parameters may be specific to the type of process to be performed and the type of tool that the system controller 1950 is configured to interface with or control. Thus as described above, the system controller 1950 may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the system controller 1950 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

An appropriate apparatus for performing the methods disclosed herein is further discussed and described in U.S. patent application Ser. No. 13/084,399 (now U.S. Pat. No. 8,728,956), filed Apr. 11, 2011, and titled "PLASMA ACTIVATED CONFORMAL FILM DEPOSITION"; and Ser. No. 13/084,305, filed Apr. 11, 2011, and titled "SILICON NITRIDE FILMS AND METHODS," each of which is incorporated herein in its entireties.

The apparatus/process described herein may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

Etching operations described herein, such as for etching nitride or oxide, may be performed in any suitable process chamber. In some embodiments, substrates may be etched in an inductively coupled plasma (ICP) reactor such as shown in FIG. 20.

Inductively coupled plasma (ICP) reactors which, in certain embodiments, may be suitable for etching operations and atomic layer deposition (ALD) operations are now described. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used.

Figure 20:
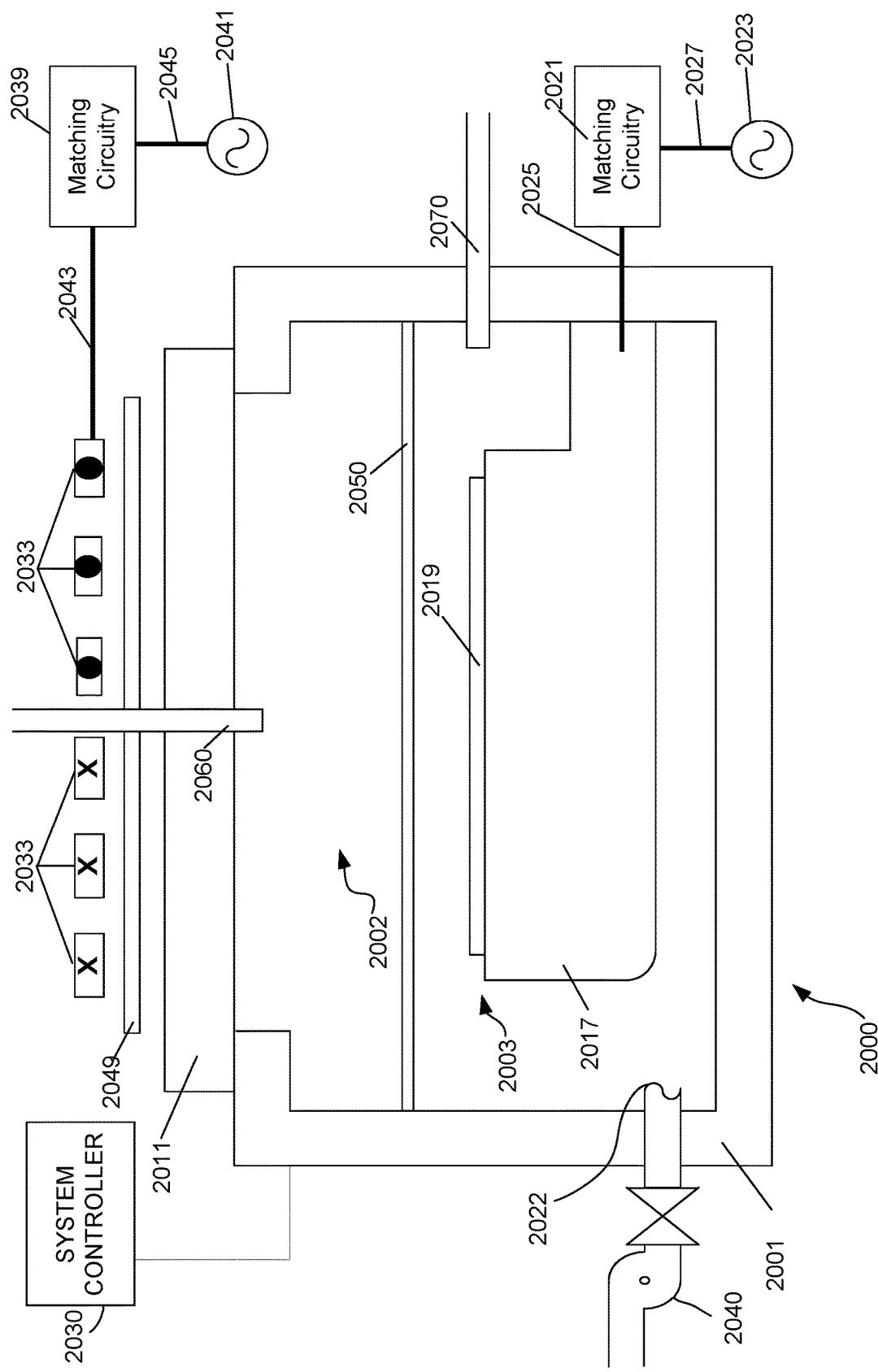

FIG. 20 schematically shows a cross-sectional view of an inductively coupled plasma integrated etching and deposition apparatus 2000 appropriate for implementing certain embodiments herein, an example of which is a Kiyo™ reactor, produced by Lam Research Corp. of Fremont, Calif. The inductively coupled plasma apparatus 2000 includes an overall process chamber 2001 structurally defined by chamber walls and a window 2011. The chamber walls may be fabricated from stainless steel or aluminum. The window 2011 may be fabricated from quartz or other dielectric material. An optional internal plasma grid 2050 divides the overall processing chamber into an upper sub-chamber 2002 and a lower sub-chamber 2003. In most embodiments, plasma grid 2050 may be removed, thereby utilizing a chamber space made of sub-chambers 2002 and 2003. A chuck 2017 is positioned within the lower sub-chamber 2003 near the bottom inner surface. The chuck 2017 is configured to receive and hold a semiconductor wafer 2019 upon which the etching and deposition processes are performed. The chuck 2017 can be an electrostatic chuck for supporting the wafer 2019 when present. In some embodiments, an edge ring (not shown) surrounds chuck 2017, and has an upper surface that is approximately planar with a top surface of a wafer 2019, when present over chuck 2017. The chuck 2017 also includes electrostatic electrodes for chucking and dechucking the wafer. A filter and DC clamp power supply (not shown) may be provided for this purpose. Other control systems for lifting the wafer 2019 off the chuck 2017 can also be provided. The chuck 2017 can be electrically charged using an RF power supply 2023. The RF power supply 2023 is connected to matching circuitry 2021 through a connection 2027. The matching circuitry 2021 is connected to the chuck 2017 through a connection 2025. In this manner, the RF power supply 2023 is connected to the chuck 2017.

Elements for plasma generation include a coil 2033 is positioned above window 2011. In some embodiments, a coil is not used in disclosed embodiments. The coil 2033 is fabricated from an electrically conductive material and includes at least one complete turn. The example of a coil 2033 shown in FIG. 20 includes three turns. The cross-sections of coil 2033 are shown with symbols, and coils having an "X" extend rotationally into the page, while coils having a "●" extend rotationally out of the page. Elements for plasma generation also include an RF power supply 2041 configured to supply RF power to the coil 2033. In general, the RF power supply 2041 is connected to matching circuitry 2039 through a connection 2045. The matching circuitry 2039 is connected to the coil 2033 through a connection 2043. In this manner, the RF power supply 2041 is connected to the coil 2033. An optional Faraday shield 2049 is positioned between the coil 2033 and the window 2011. The Faraday shield 2049 is maintained in a spaced apart relationship relative to the coil 2033. The Faraday shield 2049 is disposed immediately above the window 2011. The coil 2033, the Faraday shield 2049, and the window 2011 are each configured to be substantially parallel to one another. The Faraday shield may prevent metal or other species from depositing on the dielectric window of the plasma chamber.

Process gases may be flowed into the processing chamber through one or more main gas flow inlets 2060 positioned in the upper chamber and/or through one or more side gas flow inlets 2070. Likewise, though not explicitly shown, similar gas flow inlets may be used to supply process gases to a capacitively coupled plasma processing chamber. A vacuum pump, e.g., a one or two stage mechanical dry pump and/or turbomolecular pump 2040, may be used to draw process gases out of the process chamber 2001 and to maintain a pressure within the process chamber 2000. For example, the pump may be used to evacuate the chamber 2001. A valve-controlled conduit may be used to fluidically connect the vacuum pump to the processing chamber so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 2060 and/or 2070. In certain embodiments, process gas may be supplied only through the main gas flow inlet 2060, or only through the side gas flow inlet 2070. In some cases, the gas flow inlets shown in the figure may be replaced more complex gas flow inlets, one or more showerheads, for example. The Faraday shield 2049 and/or optional grid 2050 may include internal channels and holes that allow delivery of process gases to the chamber. Either or both of Faraday shield 2049 and optional grid 2050 may serve as a showerhead for delivery of process gases. In some embodiments, a liquid vaporization and delivery system may be situated upstream of the chamber 2001, such that once a liquid reactant is vaporized, the vaporized reactant is introduced into the chamber via a gas flow inlet 2060 and/or 2070.

Radio frequency power is supplied from the RF power supply 2041 to the coil 2033 to cause an RF current to flow through the coil 2033. The RF current flowing through the coil 2033 generates an electromagnetic field about the coil 2033. The electromagnetic field generates an inductive current within the upper sub-chamber 2002. The physical and chemical interactions of various generated ions and radicals with the wafer 2019 selectively etch features of and deposit layers on the wafer.

If the plasma grid is used such that there is both an upper sub-chamber 2002 and a lower sub-chamber 2003, the inductive current acts on the gas present in the upper sub-chamber 2002 to generate an electron-ion plasma in the upper sub-chamber 2002. The optional internal plasma grid 2050 limits the amount of hot electrons in the lower sub-chamber 2003. In some embodiments, the apparatus is designed and operated such that the plasma present in the lower sub-chamber 2003 is an ion-ion plasma.

Both the upper electron-ion plasma and the lower ion-ion plasma may contain positive and negative ions, through the ion-ion plasma will have a greater ratio of negative ions to positive ions. Volatile etching and/or deposition byproducts may be removed from the lower-sub-chamber 2003 through port 2022. The chuck 2017 disclosed herein may operate at elevated temperatures ranging between about 10° C. and about 850° C. The temperature will depend on the process operation and specific recipe.

Chamber 2001 may be coupled to facilities (not shown) when installed in a clean room or a fabrication facility. Facilities include plumbing that provide processing gases, vacuum, temperature control, and environmental particle control. These facilities are coupled to chamber 2001, when installed in the target fabrication facility. Additionally, chamber 2001 may be coupled to a transfer chamber that allows robotics to transfer semiconductor wafers into and out of chamber 2001 using typical automation.

In some embodiments, a system controller 2030 (which may include one or more physical or logical controllers) controls some or all of the operations of a processing chamber. The system controller 2030 may include any one or more characteristic described above with respect to system controller 1950.

Figure 21:
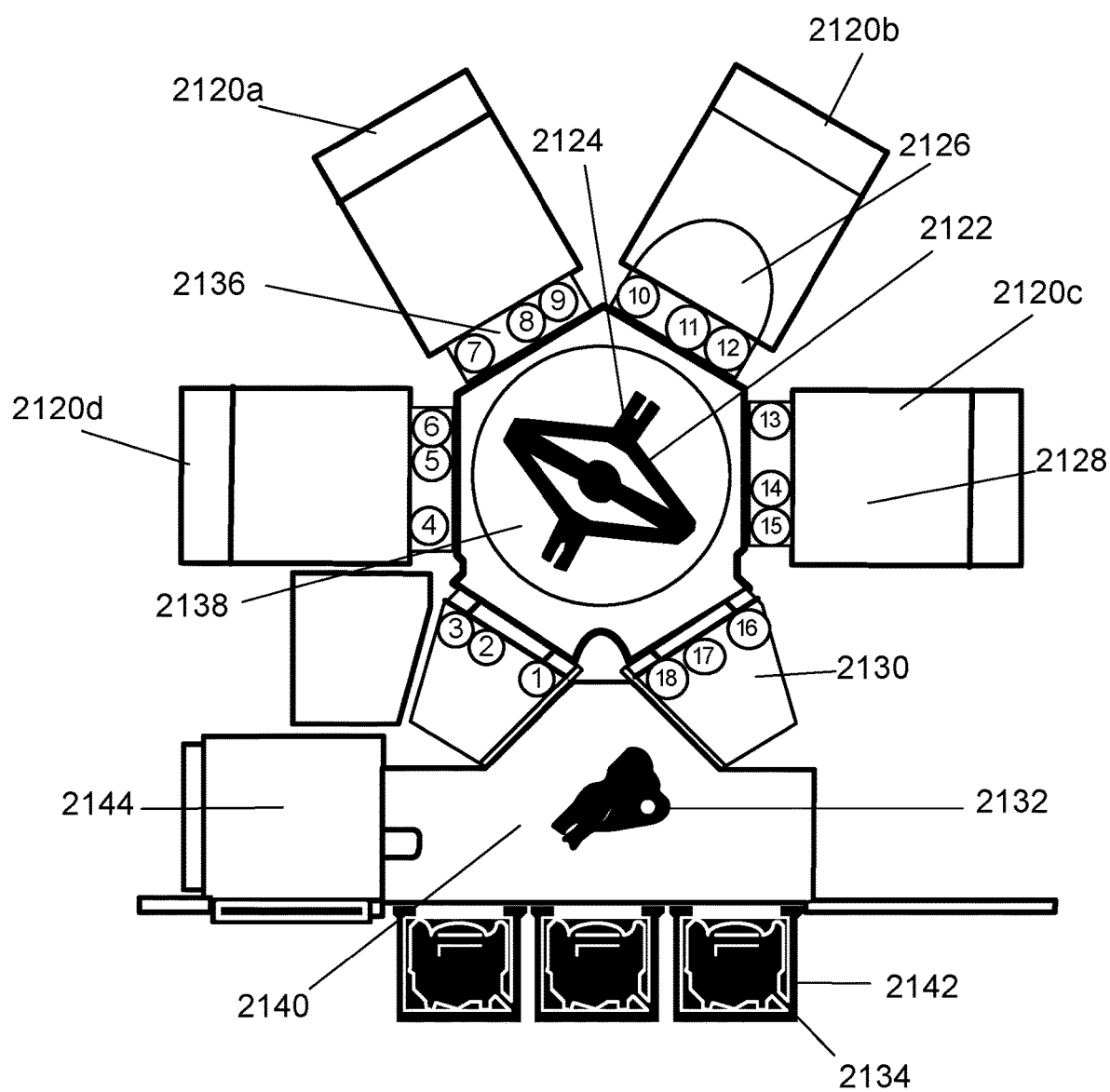

FIG. 21 depicts a semiconductor process cluster architecture with various modules that interface with a vacuum transfer module 2138 (VTM). The arrangement of transfer modules to "transfer" wafers among multiple storage facilities and processing modules may be referred to as a "cluster tool architecture" system. Airlock module 2130, also known as a loadlock or transfer module, is shown in VTM 2138 with four processing modules 2120*a*-2120*d*, which may be individual optimized to perform various fabrication processes. By way of example, processing modules 2120*a*-2120*d* may be implemented to perform substrate etching, deposition, ion implantation, wafer cleaning, sputtering, and/or other semiconductor processes. In some embodiments, ALD and selective etching are performed in the same module. In some embodiments, ALD and selective etching are performed in different modules of the same tool. One or more of the substrate etching processing modules (any of 2120*a*-2120*d*) may be implemented as disclosed herein, i.e., for depositing conformal films, selectively depositing films by ALD, etching patterns, and other suitable functions in accordance with the disclosed embodiments. Airlock module 2130 and process module 2120 may be referred to as "stations." Each station has a facet 2136 that interfaces the station to VTM 2138. Inside each facet, sensors 1-18 are used to detect the passing of wafer 2126 when moved between respective stations.

Robot 2122 transfers wafer 2126 between stations. In one embodiment, robot 2122 has one arm, and in another embodiment, robot 2122 has two arms, where each arm has an end effector 2124 to pick wafers such as wafer 2126 for transport. Front-end robot 2132, in atmospheric transfer module (ATM) 2140, is used to transfer wafers 2126 from cassette or Front Opening Unified Pod (FOUP) 2134 in Load Port Module (LPM) 2142 to airlock module 2130. Module center 2128 inside process module 2120 is one location for placing wafer 2126. Aligner 2144 in ATM 2140 is used to align wafers.

In an exemplary processing method, a wafer is placed in one of the FOUPs 2134 in the LPM 2142. Front-end robot 2132 transfers the wafer from the FOUP 2134 to an aligner 2144, which allows the wafer 2126 to be properly centered before it is etched or processed. After being aligned, the wafer 2126 is moved by the front-end robot 2132 into an airlock module 2130. Because airlock modules have the ability to match the environment between an ATM and a VTM, the wafer 2126 is able to move between the two pressure environments without being damaged. From the airlock module 2130, the wafer 2126 is moved by robot 2122 through VTM 2138 and into one of the process modules 2120*a*-2120*d*. In order to achieve this wafer movement, the robot 2122 uses end effectors 2124 on each of its arms. Once the wafer 2126 has been processed, it is moved by robot 2122 from the process modules 2120*a*-2120*d* to an airlock module 2130. From here, the wafer 2126 may be moved by the front-end robot 2132 to one of the FOUPs 2134 or to the aligner 2144.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 19 may be implemented with the tool in FIG. 21.

One aspect of the disclosure is an apparatus configured to accomplish the methods described herein. A suitable apparatus includes hardware for accomplishing the process operations and a system controller having instructions for controlling process operations in accordance with the present disclosure. In some embodiments, the apparatus for performing the aforementioned process operations can include a remote plasma source. A remote plasma source provides mild reaction conditions in comparison to a direct plasma. An example of a suitable remote plasma apparatus is described in U.S. patent application Ser. No. 14/062,648, filed Oct. 24, 2013, which is incorporated herein by reference in its entirety and for all purposes.

Figure 22:
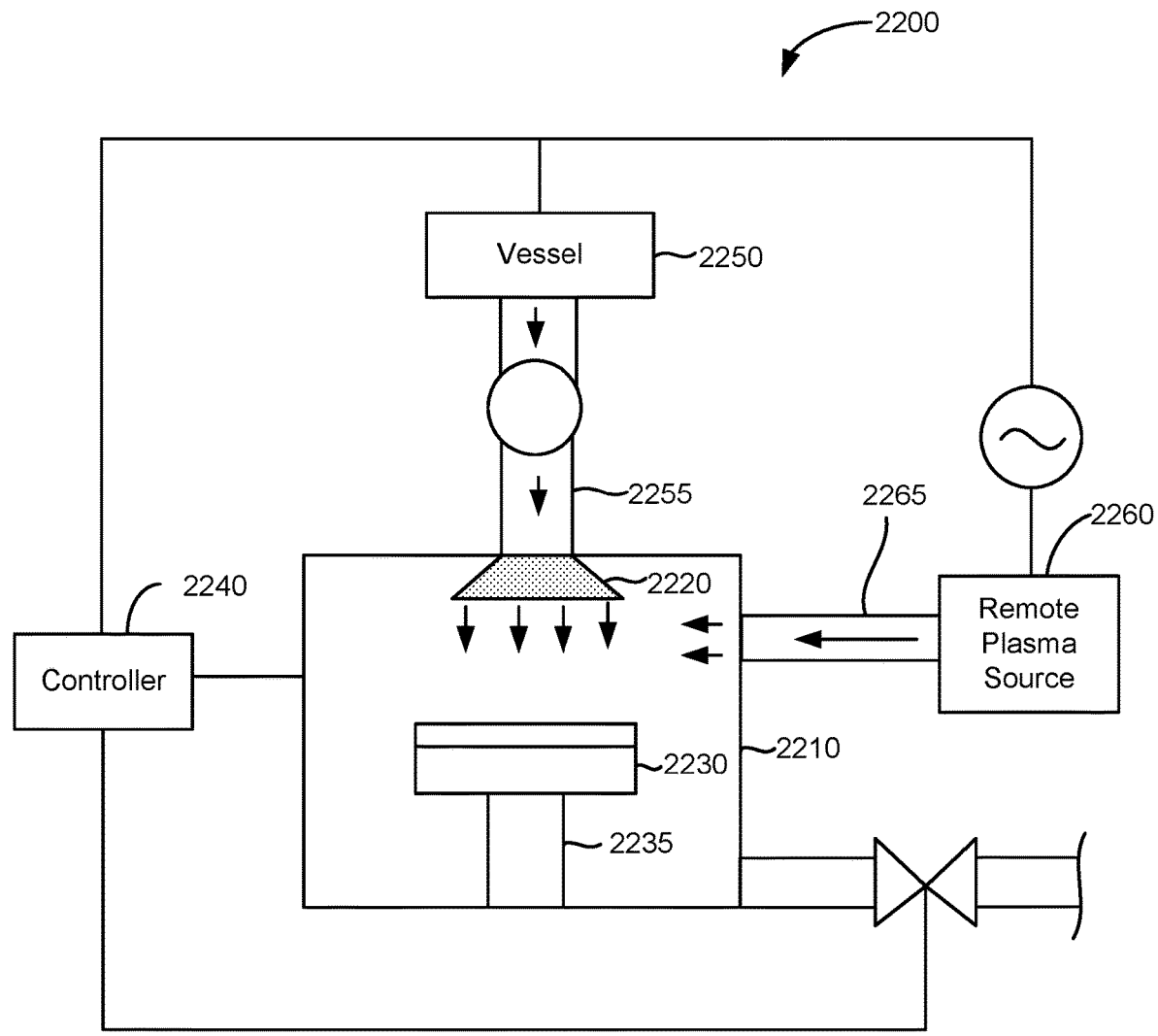

FIG. 22 presents a schematic diagram of a remote plasma apparatus according to certain embodiments. The device 2200 includes a reaction chamber 2210 with a showerhead assembly 2220. Inside the reaction chamber 2210, a substrate 2230 rests on a stage or pedestal 2235. In some embodiments, the pedestal 2235 can be fitted with a heating/cooling element. A controller 2240 may be connected to the components of the device 2200 to control the operation of the device 2200. For example, the controller 2240 may contain instructions for controlling process conditions for the operations of the device 2200, such as the temperature process conditions and/or the pressure process conditions. In some embodiments, the controller 2240 may contain instructions for controlling the flow rates of precursor gas, co-reactant gas, source gas, and carrier gas. The controller 2240 may contain instructions for changing the flow rate of the co-reactant gas over time. In addition or in the alternative, the controller 2240 may contain instructions for changing the flow rate of the precursor gas over time.

During operation, gases or gas mixtures are introduced into the reaction chamber 2210 via one or more gas inlets coupled to the reaction chamber 2210. In some embodiments, two or more gas inlets are coupled to the reaction chamber 2210. A first gas inlet 2255 can be coupled to the reaction chamber 2210 and connected to a vessel 2250, and a second gas inlet 2265 can be coupled to the reaction chamber 2210 and connected to a remote plasma source 2260. In embodiments including remote plasma configurations, the delivery lines for the precursors and the radical species generated in the remote plasma source are separated. Hence, the precursors and the radical species do not substantially interact before reaching the substrate 2230.

One or more radical species may be generated in the remote plasma source 2260 and configured to enter the reaction chamber 2210 via the gas inlet 2265. Any type of plasma source may be used in remote plasma source 2260 to create the radical species. This includes, but is not limited to, capacitively coupled plasmas, inductively coupled plasmas, microwave plasmas, DC plasmas, and laser-created plasmas. An example of a capacitively coupled plasma can be a radio frequency (RF) plasma. A high-frequency plasma can be configured to operate at 13.56 MHz or higher. An example of such a remote plasma source 2260 can be the GAMMA®, manufactured by Lam Research Corporation of Fremont, Calif. Another example of such a RF remote plasma source 2260 can be the Astron®, manufactured by MKS Instruments of Wilmington, Mass., which can be operated at 440 kHz and can be provided as a subunit bolted onto a larger apparatus for processing one or more substrates in parallel. In some embodiments, a microwave plasma can be used as the remote plasma source 2260, such as the Astex®, also manufactured by MKS Instruments. A microwave plasma can be configured to operate at a frequency of 2.45 GHz. Gas provided to the remote plasma source may include hydrogen, nitrogen, oxygen, and other gases as mentioned elsewhere herein. In certain embodiments, hydrogen is provided in a carrier such helium. As an example, hydrogen gas may be provided in a helium carrier at a concentration of about 1-10% hydrogen.

The precursors can be provided in vessel 2250 and can be supplied to the showerhead 2220 via the first gas inlet 2255. The showerhead 2220 distributes the precursors into the reaction chamber 2210 toward the substrate 2230. The substrate 2230 can be located beneath the showerhead 2220. It will be appreciated that the showerhead 2220 can have any suitable shape, and may have any number and arrangement of ports for distributing gases to the substrate 2230. The precursors can be supplied to the showerhead 2220 and ultimately to the substrate 2230 at a controlled flow rate.

The one or more radical species formed in the remote plasma source 2260 can be carried in the gas phase toward the substrate 2230. The one or more radical species can flow through a second gas inlet 2265 into the reaction chamber 2210. It will be understood that the second gas inlet 2265 need not be transverse to the surface of the substrate 2230 as illustrated in FIG. 22. In certain embodiments, the second gas inlet 2265 can be directly above the substrate 2230 or in other locations. The distance between the remote plasma source 2260 and the reaction chamber 2210 can be configured to provide mild reactive conditions such that the ionized species generated in the remote plasma source 2260 are substantially neutralized, but at least some radical species in substantially low energy states remain in the environment adjacent to the substrate 2230. Such low energy state radical species are not recombined to form stable compounds. The distance between the remote plasma source 2260 and the reaction chamber 2210 can be a function of the aggressiveness of the plasma (e.g., determined in part by the source RF power level), the density of gas in the plasma (e.g., if there's a high concentration of hydrogen atoms, a significant fraction of them may recombine to form $H_2$ before reaching the reaction chamber 2210), and other factors. In some embodiments, the distance between the remote plasma source 2260 and the reaction chamber 2210 can be between about 1 cm and 30 cm, such as about 5 cm or about 15 cm.

In some embodiments, a co-reactant, which is not the primary silicon-containing precursor or a hydrogen radical, is introduced during the deposition reaction. In some implementations, the apparatus is configured to introduce the co-reactant through the second gas inlet 2265, in which case the co-reactant is at least partially converted to plasma. In some implementations, the apparatus is configured to introduce the co-reactant through the showerhead 2220 via the first gas inlet 2255. Examples of the co-reactant include oxygen, nitrogen, ammonia, carbon dioxide, carbon monoxide, and the like. The flow rate of the co-reactant can vary over time to produce a composition gradient in a graded film.

The controller 2240 may contain instructions for controlling process conditions for the operation of the device 2200. The controller 2240 will typically include one or more memory devices and one or more processors. The processor may include a CPU or computer, analog and/or digital input/output connections, stepper motor controller boards, etc. Instructions for implementing appropriate control operations are executed on the processor. These instructions may be stored on the memory devices associated with the controller 2240 or they may be provided over a network.

In certain embodiments, the controller 2240 controls all or most activities of the semiconductor processing device 2200 described herein. For example, the controller 2240 may control all or most activities of the semiconductor processing device 2200 associated with depositing a silicon carbide film as a carbon-containing encapsulation layer as described herein. The controller 2240 may execute system control software including sets of instructions for controlling the timing, gas composition, gas flow rates, chamber pressure, chamber temperature, RF power levels, substrate position, and/or other parameters. Other computer programs, scripts, or routines stored on memory devices associated with the controller 2240 may be employed in some embodiments. To provide relatively mild reactive conditions at the environment adjacent to the substrate 2230, parameters such as the RF power levels, gas flow rate to the remote plasma region, and timing of the plasma ignition can be adjusted and maintained by controller 2240. Additionally, adjusting the substrate position may further reduce the presence of high-energy radical species at the environment adjacent to the substrate 2230. In a multi-station reactor, the controller 2240 may comprise different or identical instructions for different apparatus stations, thus allowing the apparatus stations to operate either independently or synchronously.

In some embodiments, the controller 2240 may include instructions for performing operations such as flowing a silicon-containing precursor through the first gas inlet 2255 into the reaction chamber 2210, providing one or more radical species of a source gas in a substantially low energy state from the remote plasma source 2260, flowing a co-reactant gas through the second gas inlet 2265 into the reaction chamber 2210, and flowing the one or more radical species through the second gas inlet 2265 into the reaction chamber 2210 to react with the silicon-containing precursor to form the carbon-containing encapsulation layer on the substrate 2230. In some implementations, the controller 2240 may include instructions for changing a flow rate of the silicon-containing precursor over time. A controller as described above with respect to FIG. 19 may be implemented with the apparatus in FIG. 22.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a semiconductor substrate for fabricating a 3D NAND structure, the method comprising:
   providing a substrate having alternating layers of a first oxide and a nitride in a staircase pattern; and
   prior to depositing a second oxide over the staircase pattern, depositing a carbon-containing encapsulation layer to encapsulate both the first oxide and nitride layers by:
      introducing a silicon-containing and carbon-containing precursor,
      introducing a source gas in a plasma source remote from a chamber housing the substrate,
      generating one or more radicals of the source gas in the plasma source from the source gas, and
      introducing the one or more radicals of the source gas onto the substrate,
   wherein all or substantially all of the one or more radicals of the source gas are in a substantially low energy state that react with the silicon-containing and carbon containing precursor to form the carbon-containing encapsulation layer, and
   wherein the carbon-containing encapsulation layer comprises material selected from the group consisting of oxygen-doped silicon carbide and nitrogen-doped silicon carbide, and combinations thereof.

2. The method of claim 1, wherein dry etch selectivity of the second oxide to the carbon-containing encapsulation layer is between about 2:1 and about 100:1.

3. The method of claim 1, wherein the carbon-containing encapsulation layer is deposited to a thickness between about 1 nm and about 250 nm.

4. The method of claim 1, wherein the carbon-containing encapsulation layer is deposited by atomic layer deposition or chemical vapor deposition.

5. The method of claim 1, wherein the carbon-containing encapsulation layer prevents degradation at an interface between the first oxide and the second oxide.

6. The method of claim 1, wherein each of the first oxide layers and nitride layers is between about 10 nm to about 100 nm in thickness.

7. The method of claim 1, wherein the staircase pattern comprises steps, each step comprising one oxide and one nitride layer, wherein each step comprises a pad extending outward from an edge of an adjacent overlying step having a width of about 150 nm to about 1000 nm.

8. The method of claim 1, further comprising:
   after depositing the carbon-containing encapsulation layer, depositing the second oxide over the staircase pattern;
   etching a vertical slit in the staircase pattern;
   selectively etching the nitride layers relative to the first oxide, second oxide, and carbon-containing encapsulation layer to form gaps between the first oxide layers;
   depositing tungsten in the gaps between the first oxide layers to form tungsten word lines;
   etching the second oxide to form vertical vias in the second oxide to the tungsten word lines, wherein the second oxide is etched selective to the carbon-containing encapsulation layer;
   etching the carbon-containing encapsulation layer selective to the first oxide, the second oxide, and the tungsten word lines to expose the tungsten word lines at bottoms of the vertical vias; and
   depositing tungsten in the vertical vias to form tungsten interconnects to the tungsten word lines.

9. The method of claim 8, wherein the vertical vias comprise vias having different depths.

10. The method of claim 9, wherein the different depths range from between about 1 micron to about 12 microns.

11. The method of claim 8, wherein the vertical vias have a critical dimension between about 50 nm and about 500 nm.

12. The method of claim 1, wherein the first oxide layer is deposited at a deposition temperature different from that of a deposition temperature for depositing the second oxide.

13. The method of claim 1, wherein the radicals generated from the plasma source have a low energy state and the carbon-containing encapsulation layer has a conformality between about 80% and 100%.

14. A method of processing a semiconductor substrate for fabricating a 3D NAND structure, the method comprising:
   providing a substrate having alternating layers of a first oxide and a nitride in a staircase pattern; and
   prior to depositing a second oxide over the staircase pattern, depositing a carbon-containing encapsulation layer to encapsulate both the first oxide and nitride layers,
   wherein carbon content in the carbon-containing encapsulation layer is between about 10-15% atomic.

* * * * *